(12) United States Patent
Toyoda et al.

(10) Patent No.: US 10,275,970 B2
(45) Date of Patent: Apr. 30, 2019

(54) SIGNAL PROCESSING DEVICE, SIGNAL PROCESSING METHOD AND INFORMATION READING APPARATUS

(71) Applicant: MITSUBISHI ELECTRIC CORPORATION, Tokyo (JP)

(72) Inventors: Yoshitaka Toyoda, Tokyo (JP); Satoshi Yamanaka, Tokyo (JP); Naoyuki Fujiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 420 days.

(21) Appl. No.: 14/438,846

(22) PCT Filed: Nov. 13, 2013

(86) PCT No.: PCT/JP2013/080685
§ 371 (c)(1),
(2) Date: Apr. 27, 2015

(87) PCT Pub. No.: WO2014/077276
PCT Pub. Date: May 22, 2014

(65) Prior Publication Data
US 2015/0287260 A1    Oct. 8, 2015

(30) Foreign Application Priority Data
Nov. 14, 2012    (JP) .................... 2012-250055

(51) Int. Cl.
*G07D 7/04* (2016.01)
*G07D 7/20* (2016.01)
(Continued)

(52) U.S. Cl.
CPC ........... *G07D 7/04* (2013.01); *G01R 33/0023* (2013.01); *G01R 33/02* (2013.01); *G07D 7/20* (2013.01)

(58) Field of Classification Search
CPC ...... G01R 33/0023; G01R 33/02; G07D 7/04; G07D 7/20
See application file for complete search history.

(56) References Cited

U.S. PATENT DOCUMENTS 5,699,459 A * 12/1997 Kawahara ............... G06T 9/007
375/240.24
6,630,681 B1 * 10/2003 Kojima .................. B82Y 10/00
250/282
(Continued)

FOREIGN PATENT DOCUMENTS

CN    101201945 A    6/2008
CN    101706945 A    5/2010
(Continued)

OTHER PUBLICATIONS

Yoshinori, et al, Machine Translation of JP2012128683, Accessed May 11, 2017.*

*Primary Examiner* — Edward Park
(74) *Attorney, Agent, or Firm* — Birch, Stewart, Kolasch & Birch, LLP

(57) ABSTRACT

A pattern presence/absence evaluation value generation unit (41) determines the presence or absence of a pattern by comparing sensing data (d3) and correction data (d44). Operating according to a pattern presence/absence evaluation value (d41) obtained from the pattern presence/absence evaluation value generation unit (41), a correction data updating unit (42) outputs correction data (d42) updated by weighted addition of the sensing data (d3) and the correction data (d44), increasing the weighting of the correction data (d44) when an image pattern is present and increasing the weighting of the sensing data (d3) when the image pattern is absent. A correction data subtraction unit (43) subtracts the correction data (d42) from the sensing data (d3) and outputs output sensing data (d4). It consequently becomes possible (Continued)

to reduce the effect of sensing signal level variations of the sensing signal generated within the interval of reading of the object being sensed, and read the pattern accurately.

19 Claims, 12 Drawing Sheets

(51) Int. Cl.
*G01R 33/02* (2006.01)
*G01R 33/00* (2006.01)

(56) References Cited

U.S. PATENT DOCUMENTS

| | | | |
|---|---|---|---|
| 7,593,961 | B2 | 9/2009 | Eguchi et al. |
| 8,260,027 | B2 | 9/2012 | Nireki |
| 8,510,062 | B2 | 8/2013 | Domke et al. |
| 2006/0280362 | A1 | 12/2006 | Umeda |
| 2007/0031021 | A1 | 2/2007 | Natori |
| 2007/0085538 | A1* | 4/2007 | Hinks ............... G01R 33/56341 324/309 |
| 2010/0207621 | A1 | 8/2010 | Yano |
| 2011/0096366 | A1 | 4/2011 | Oka |
| 2012/0243796 | A1 | 9/2012 | Saito |

FOREIGN PATENT DOCUMENTS

| | | | |
|---|---|---|---|
| CN | 102136166 | A | 7/2011 |
| CN | 102568081 | A | 7/2012 |
| CN | 102592350 | A | 7/2012 |
| CN | 102693425 | A | 9/2012 |
| EP | 0056116 | A1 | 7/1982 |
| JP | 2-168191 | A | 6/1990 |
| JP | 5-94569 | A | 4/1993 |
| JP | 9-330451 | A | 12/1997 |
| JP | 10-283522 | A | 10/1998 |
| JP | 2002-298186 | A | 10/2002 |
| JP | 2007-36378 | A | 2/2007 |
| JP | 2008-59113 | A | 3/2008 |
| JP | 2011-95861 | A | 5/2011 |
| JP | 2012-128683 | * | 7/2012 |
| JP | 2012-128683 | A | 7/2012 |
| JP | 2012-181855 | A | 9/2012 |
| JP | 2013-126234 | A | 6/2013 |
| JP | 2013-131053 | A | 7/2013 |
| RU | 2441229 | C2 | 8/2010 |
| RU | 2009105183 | A | 8/2010 |
| WO | WO 2009/075986 | A2 | 6/2009 |

\* cited by examiner

SIGNAL PROCESSING DEVICE, SIGNAL PROCESSING METHOD AND INFORMATION READING APPARATUS

TECHNICAL FIELD

The present invention relates to an information reading apparatus having a sensor. More particularly, the invention relates to an information reading apparatus suitable for reading pattern information, such as an image printed with magnetic ink on paper currency or other such paper notes, by using a line sensor, in which a plurality of sensing elements are disposed in a line.

BACKGROUND ART

As one information reading apparatus of this type, there is a magnetic sensing apparatus having a line sensor with a plurality of magnetic sensors whose resistance values change when a magnetic field is applied, and which are disposed in a line. The magnetic sensing apparatus is used in, e.g., a paper currency identification apparatus that identifies paper currency. By means of the magnetic sensors, the paper currency identification apparatus detects an image printed with magnetic ink on the paper currency to be identified. The paper currency identification apparatus also makes determination on the validity, denomination, and so on of the paper currency on the basis of similarity between the detected printed image and a stored reference image.

Because the magnetic field due to the magnetic ink used to print the image on the paper currency or the like is quite weak, the sensing signal obtained by the magnetic sensing apparatus is quite weak. Moreover, a direct current component (offset component) is added to the sensing signal in the magnetic sensing apparatus. The sensing signal must accordingly be amplified and the offset component must be removed. The offset component varies, however, with environmental changes such as changes in the ambient temperature, and with aging changes and the like in the magnetic sensors. It is therefore not easy to separate the offset component in the sensing signal.

A technique for correcting non-uniformity in the level of the sensing signal due to the temperature of the magnetic sensing elements and so on is disclosed in the magnetic pattern sensing apparatus described in patent reference 1. The magnetic pattern sensing apparatus in patent reference 1 performs an offset adjustment during each interval between the passage of one piece of paper currency through the magnetic sensing apparatus and the passage of the next piece of paper currency through the magnetic sensing apparatus.

PRIOR ART REFERENCES

Patent References

Patent reference 1: Japanese Patent Application Publication No. 2012-128683 (paragraphs 0049-0062, FIGS. 4-6)

SUMMARY OF THE INVENTION

Problem to be Solved by the Invention

The offset adjustment method in patent reference 1, however, calculates the offset adjustment value only in the interval between one piece of paper currency and the next. Throughout the interval in which it is reading a piece of paper currency, the offset adjustment method in patent reference 1 applies the same offset adjustment value. A consequent problem is that when the sensing signal level varies during the interval in which a piece of paper currency is being read, non-uniformity in the level of the sensing signal cannot be adequately corrected.

There has been a similar problem in apparatus that reads information from image patterns other than magnetic patterns.

This problem is addressed by the present invention, which reduces the effect of variations in the level of the sensing signal that occur during the reading period of each object being sensed. By quickly correcting the non-uniformity in the level of the sensing signal, the invention can read pattern information accurately.

Means for Solving the Problem

A signal processing device according to the present invention comprises:

a pattern presence/absence evaluation value generation unit for calculating, on a basis of sensing data which includes a signal component of an object being sensed and which is obtained by sequential sensing, by a sensing element, of the object being scanned, a degree of inclusion of the signal component in the sensing data;

a correction data updating unit for taking a weighted sum of correction data representing a direct current component of the sensing element and the sensing data to generate updated correction data, with weight given to the correction data being greater as said degree increases, and weight given to the sensing data being greater as said degree decreases; and a correction data subtraction unit for subtracting the updated correction data from the sensing data to generate corrected sensing data.

Effect of the Invention

The invention can reduce the effect of variations in the level of a sensing signal that occur during the reading period of each object that is sensed.

FIRST EMBODIMENT

Figure 1:
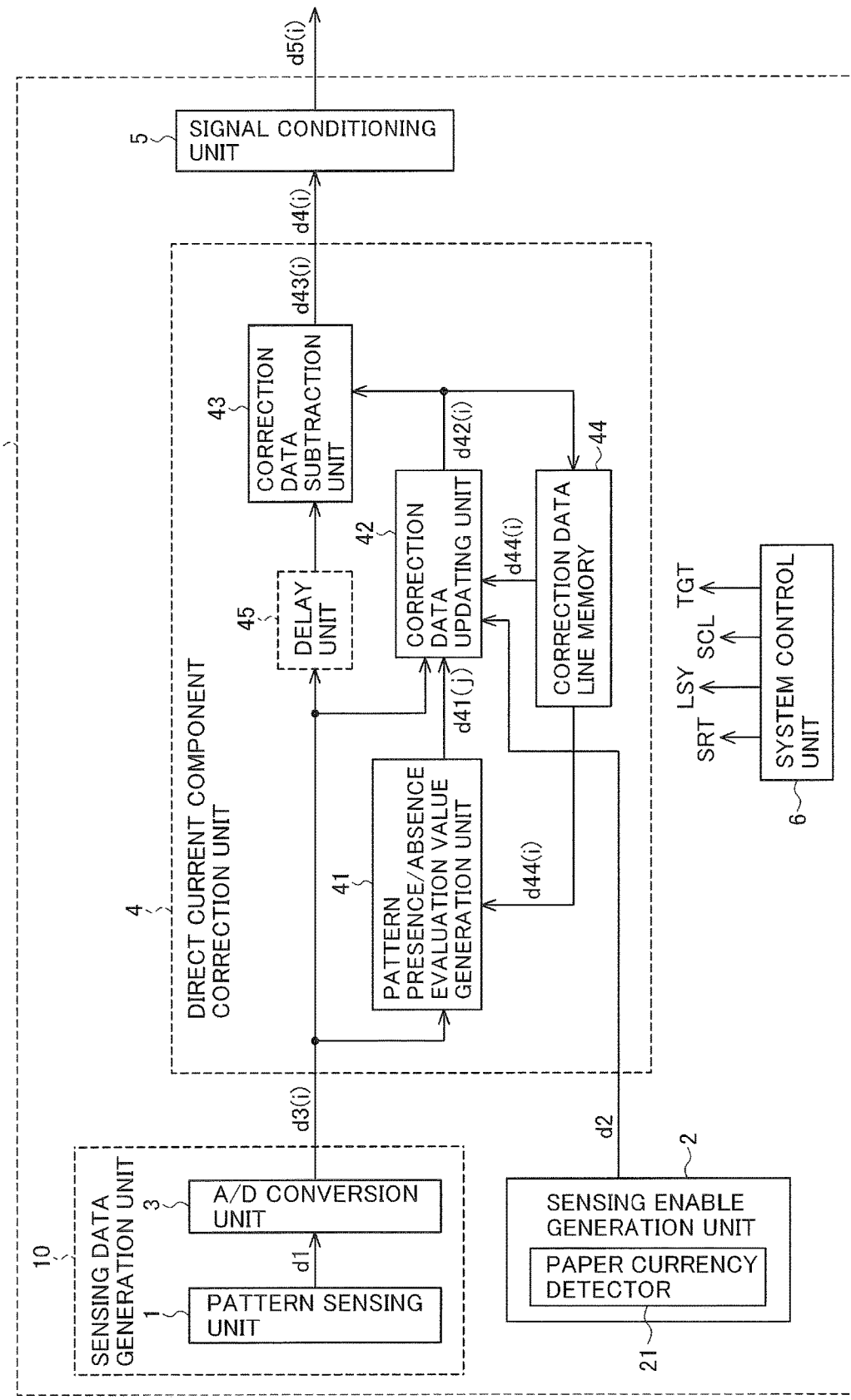
FIG. 1 is a block diagram illustrating an information reading apparatus in a first embodiment of the invention.

FIG. 1 shows the structure of an information reading apparatus 100 according to a first embodiment of the invention. The information reading apparatus 100 has a pattern sensing unit 1, a sensing enable generation unit 2, an A/D conversion unit 3, a direct current component correction unit 4, a signal conditioning unit 5, and a system control unit 6. The direct current component correction unit 4 has a pattern presence/absence evaluation value generation unit 41, a correction data updating unit 42, a correction data subtraction unit 43, and a correction data line memory 44. The direct current component correction unit 4 may also have a delay unit 45. The direct current component correction unit 4 is a signal processing device.

MODE FOR CARRYING OUT THE INVENTION

First Embodiment

FIG. 1 shows the structure of an information reading apparatus 100 according to a first embodiment of the invention. The information reading apparatus 100 has a pattern presence/absence evaluation value generation unit 41, a correction data updating unit 42, and a correction data subtraction unit 43. The information reading apparatus 100 may also have a pattern sensing unit 1, a sensing enable generation unit 2, an A/D conversion unit 3, a signal conditioning unit 5, and a system control unit 6, or a delay unit 45. The direct current component correction unit 4 has a pattern presence/absence evaluation value generation unit 41, a correction data updating unit 42, a correction data subtraction unit 43, and a correction data line memory 44. The direct current component correction unit 4 may also have a delay unit 45. The direct current component correction unit 4 is a signal processing device.

The pattern sensing unit 1 senses an image pattern of an object that is sensed (an object that is read). The pattern sensing unit 1 outputs a sensing signal d1 in analog form.

The sensing enable generation unit 2 outputs a sensing enable signal d2. The sensing enable signal d2 distinguishes intervals in which image pattern sensing is and is not performed. For example, it indicates whether or not the object is in the sensing area. The 'sensing area' is an area in which pattern information is read.

The A/D conversion unit 3 receives, as its input, the sensing signal d1. The A/D conversion unit 3 converts the sensing signal d1 to sensing data d3 in digital form.

A sensing data generation unit 10 includes the pattern sensing unit 1 and the A/D conversion unit 3. The sensing data generation unit 10 senses the image pattern. The sensing data generation unit 10 outputs the sensing data d3, representing the sensing result.

The direct current component correction unit 4 receives, as its inputs, the sensing data d3 and the sensing enable signal d2. The direct current component correction unit 4 outputs corrected sensing data d4 in which a direct current component in a secondary scanning direction Y has been removed from the sensing data d3. The direction of motion (direction of transport) of the paper currency 13 with respect to the pattern sensing unit 1 is referred to as the secondary scanning direction.

The signal conditioning unit 5 receives, as its input, the corrected sensing data d4. The signal conditioning unit 5 performs signal conditioning on the corrected sensing data d4. The signal conditioning unit 5 outputs conditioned sensing data d5.

A more detailed description will be given below, taking as an example a case in which the object being read is paper currency, and the information reading apparatus is a magnetic sensing apparatus that detects a magnetic pattern from an image printed with magnetic ink on the paper currency.

The system control unit 6 outputs a system reset signal SRT, a line synchronization signal LSY, a system clock signal SCL, and data indicating a target value TGT.

The line synchronization signal LSY is a signal that aligns timings in one-line cycles. The line synchronization signal LSY is generated once per line cycle. The line synchronization signal LSY is a synchronization signal of a negative polarity.

The system reset signal SRT is a signal for placing the information reading apparatus 100 in its initial state.

The target value TGT is a value of the direct current component of the signal that undergoes direct current component correction in the direct current component correction unit 4.

The system clock signal SCL is a signal that aligns the timing of the operation of a plurality of circuits by cyclically assuming a high voltage state and a low voltage state.

The line synchronization signal LSY and the system clock signal SCL are supplied to the pattern sensing unit 1, the A/D conversion unit 3, the direct current component correction unit 4, and the signal conditioning unit 5 (the signal lines by which they are supplied are omitted from the drawings). The line synchronization signal LSY and the system clock signal SCL are used to synchronize processing in the pattern sensing unit 1, the A/D conversion unit 3, the direct current component correction unit 4, and the signal conditioning unit 5.

Figure 2:
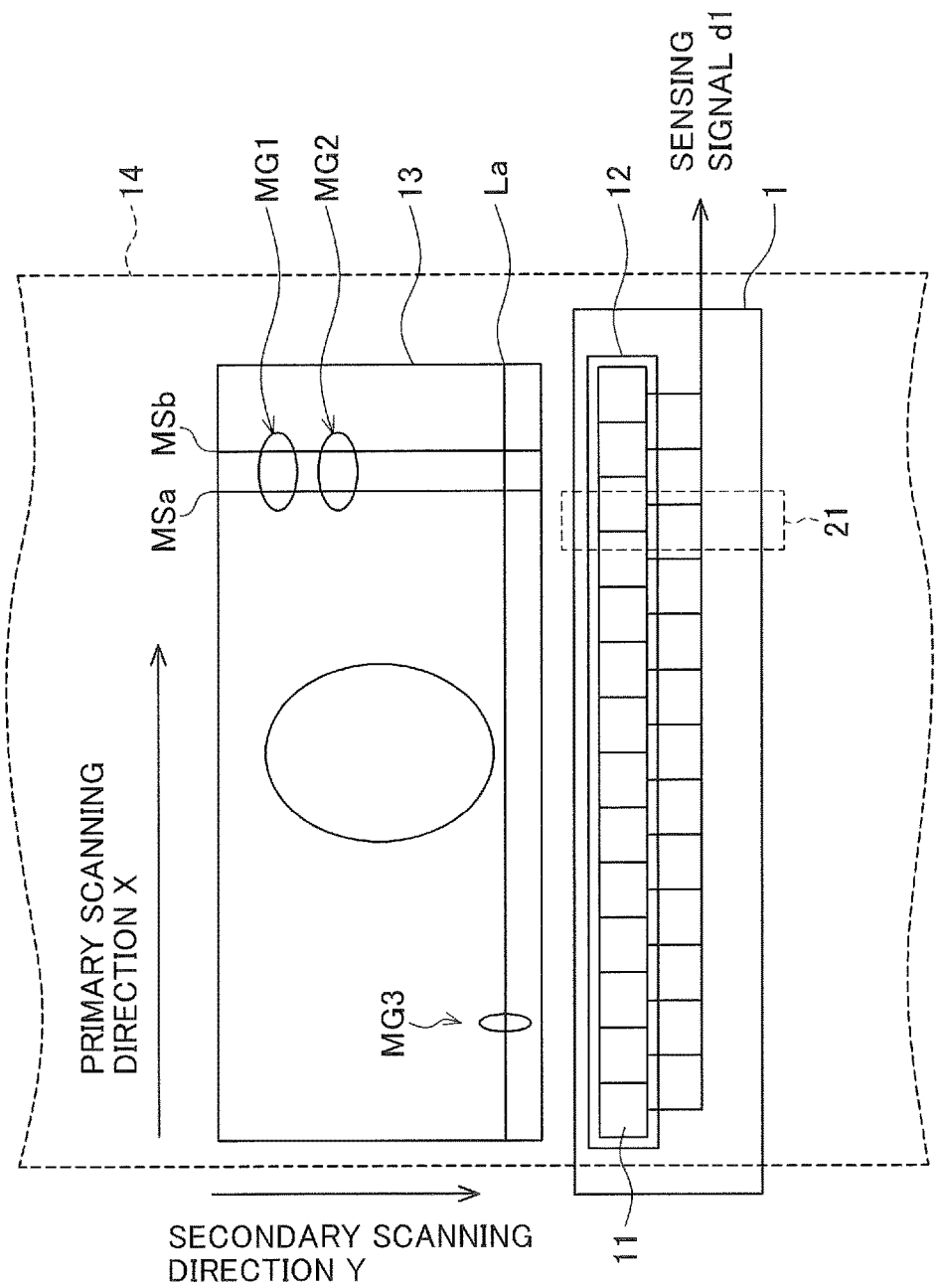
FIG. 2 illustrates the schematic structure and the operation of the pattern sensing unit 1 in FIG. 1.

FIG. 2 illustrates the schematic structure and the operation of the pattern sensing unit 1. As shown in FIG. 2, the pattern sensing unit 1 has a line sensor 12. The line sensor 12 has a plurality of magnetic sensors (sensing elements) 11 which are disposed in a line and whose resistance values change when a magnetic field is applied. The line sensor 12 senses a magnetic pattern provided on the paper currency 13. The line sensor 12 outputs the sensing signal d1.

The plurality of sensing elements 11 of the line sensor 12 sense the magnetic pattern in their order of arrangement. The sequential output of the sensing signal d1 from the sensing elements 11 is referred to as primary scanning. A wire extends from the bottom of each sensing element 11 in FIG. 2. The sensing signal d1 is output through these wires. The longitudinal direction of the line sensor 12 is referred to as a primary scanning direction. The longitudinal direction is the left-right direction in FIG. 2. The paper currency 13 has regions MG1, MG2, and MG3 with magnetic patterns. The region MG3 is positioned on a sensing line La in the primary scanning direction X in FIG. 2.

The paper currency 13 is transported by a transport belt 14 or the like. The paper currency 13 passes through the sensing area. The sensing area is the area in which the magnetic pattern is sensed by the pattern sensing unit 1. The transport belt 14 is shown schematically by dashed lines in FIG. 2. The paper currency 13 is oriented so that its short side direction is the secondary scanning direction Y and its long side direction is the primary scanning direction X. The direction of motion (direction of transport) of the paper currency 13 with respect to the pattern sensing unit 1 is referred to as the secondary scanning direction. Here, the transport direction of the paper currency 13 is the secondary scanning direction Y. Depending on the device configuration, the pattern sensing unit 1 may move with respect to the paper currency 13.

The primary scanning is performed taking each sensing element 11 as a unit. The secondary scanning is performed taking each sensing line La as a unit. A 'sensing line' is a line-like area that is read in one primary scan. The sensing area is the range within which the magnetic pattern is sensed as the sensing line moves in the secondary scanning direction.

The sensing data generation unit 10 scans the paper currency 13 in the primary scanning direction X with the line sensor 12 while the paper currency 13 is moved in the transport direction with respect to the line sensor 12. As a result, the sensing data generation unit 10 can obtain data representing a two-dimensional image of the paper currency 13. Here, the data representing the two-dimensional image the sensing data d3.

The paper currency 13 has the regions MG1 and MG2 with magnetic patterns. The regions MG1 and MG2 are disposed on lines MSa and MSb extending in the secondary scanning direction Y.

The sensing of the magnetic pattern on the paper currency 13 by the pattern sensing unit 1 is carried out in synchronization with the line synchronization signal LSY output from the system control unit 6. That is, sensing of one sensing line La is performed each time the line synchronization signal LSY occurs. The sensing of one sensing line La consists of sensing by all the sensing elements 11 in the line sensor 12. Concurrently with the sensing of one sensing line La, the paper currency 13 is transported by one sensing line La in the secondary scanning direction Y.

The sensing signals for a plurality of scanning lines La are output sequentially by repetitions of this process.

When the dimension of the paper currency 13 in the primary scanning direction X is shorter than the longitudinal dimension of the line sensor 12, the sensing of the magnetic pattern may be carried out only by the sensing elements 11 positioned within the extent of the dimension of the paper currency 13 in the primary scanning direction X. The sensing of the magnetic pattern is the reading of the magnetic pattern. In this case, the primary scanning of one sensing line La is completed by the sensing by all of the sensing elements 11 that are positioned within the extent of the width of the paper currency 13.

Figure 3:
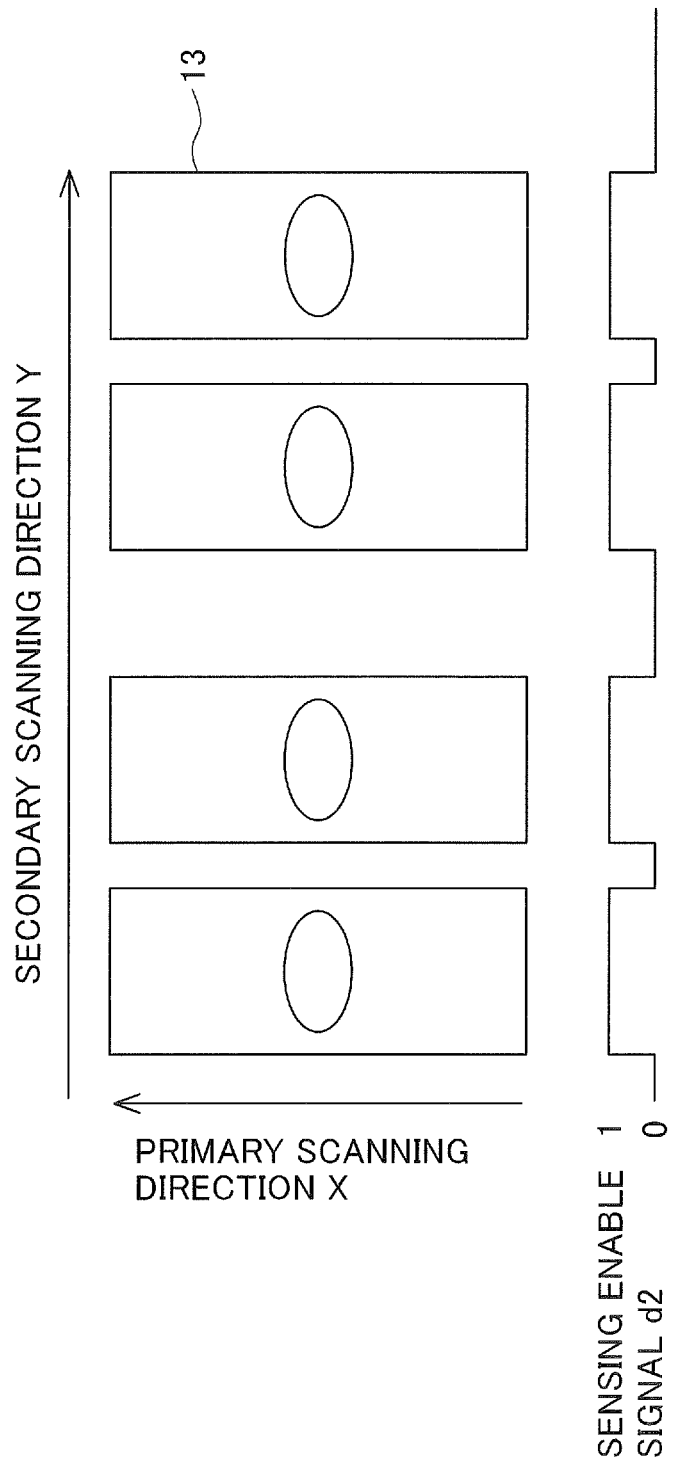
FIG. 3 illustrates the operation of the sensing enable generation unit 2 in FIG. 1.

As shown in FIGS. 1 and 2, the sensing enable generation unit 2 has a paper currency detector 21. On the basis of the output of the paper currency detector 21, the sensing enable generation unit 2 generates the sensing enable signal d2 as shown in FIG. 3. The sensing enable generation unit 2 outputs the sensing enable signal d2.

FIG. 3 illustrates the operation of the sensing enable generation unit 2. To make it easy to understand the relation between the paper currency 13 and the sensing enable signal d2, FIG. 3 depicts both the paper currency 13 and the sensing enable signal d2 in a single drawing.

The paper currency 13 is depicted in the upper part of FIG. 3. The primary scanning direction X is the up-down direction in FIG. 3; the secondary scanning direction Y is the right-left direction in FIG. 3. Four pieces of paper currency 13 are arranged in a row in the secondary scanning direction Y.

The sensing enable signal d2 is depicted in the lower part of FIG. 3. The left-right direction in FIG. 3 indicates the reading intervals in the secondary scanning direction Y. The up-down direction in FIG. 3 indicates the output value of the sensing enable signal d2.

The sensing enable signal d2 is a rectangular signal. The sensing enable signal d2 is '1' in the intervals in the secondary scanning direction Y in which the paper currency 13 is positioned. The sensing enable signal d2 is '0' in the intervals in the secondary scanning direction Y in which the paper currency 13 is not positioned.

The sensing enable signal d2 is a signal that indicates whether sensing is valid or invalid in the reading intervals in the secondary scanning direction Y. The sensing enable signal d2 is '1' in the intervals in which the paper currency 13 is passing through the sensing area (the intervals in which the magnetic pattern is sensed). The sensing enable signal d2 is '0' in the intervals in which the paper currency 13 is not passing through the sensing area.

The intervals in which the paper currency 13 is passing through the sensing area are intervals in which the magnetic pattern sensing is valid. The intervals in which the paper currency 13 is not passing through the sensing area are intervals in which the magnetic pattern sensing is invalid.

FIGS. 4(a) to 4(e) are timing diagrams illustrating signals output from the A/D conversion unit 3 in FIG. 1. In FIGS. 4(a) to 4(e), the horizontal axis indicates time, and the vertical axis indicates the signal level.

Figure 4:
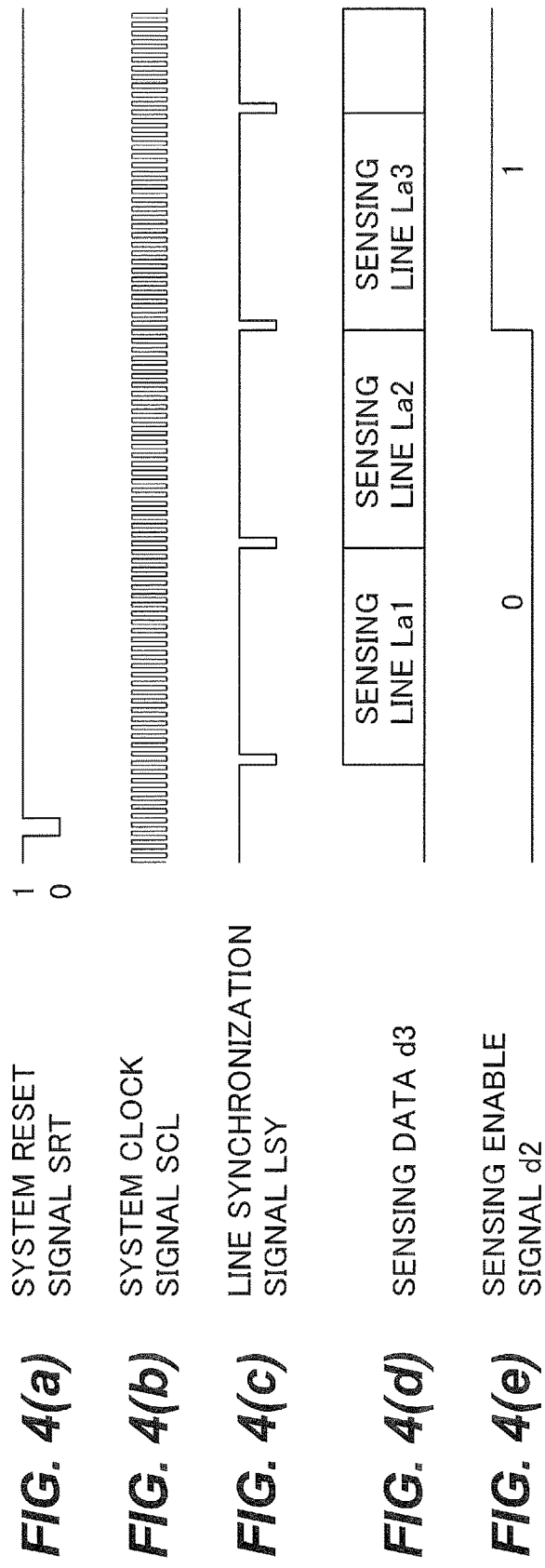
FIGS. 4(a) to 4(e) are timing diagrams illustrating signals output from the A/D conversion unit 3 in FIG. 1.

Receiving the sensing signal d1 as its input, the A/D conversion unit 3 operates in synchronization with the system reset signal SRT, the system clock signal SCL, and the line synchronization signal LSY. The system reset signal SRT is shown in FIG. 4(a). The system clock signal SCL is shown in FIG. 4(b). The line synchronization signal LSY is shown in FIG. 4(c). The A/D conversion unit 3 performs A/D conversion on the sensing signal d1 and outputs the sensing data d3 in digital form. The sensing data d3 in digital form is shown in FIG. 4(d). The sensing enable signal d2 is shown in FIG. 4 (e).

When the system is reset, the system reset signal SRT changes from '1' to '0' and then back to '1'.

The line synchronization signal LSY changes from '1' to '0' and then back to '1' when the sensing data d3 for a sensing line La is output. The sensing data d3 for respective lines La are output in turn. In FIG. 4(d), a sensing line La1, a sensing line La2, and a sensing line La3 are shown, being aligned in the time axis direction.

The sensing enable signal d2 is '0' in the sensing lines La1 and La2.

The sensing enable signal d2 is '1' in and after the sensing line La3.

To emphasize that the sensing data d3 indicates a value for each sensing element 11, reference characters d4(i) will sometimes be used below. Reference character i indicates that the data is associated with the i-th sensing element 11 in the line sensor 12. The same is true of other data to which reference character i is affixed. To indicate the data of each sensing line La, a '(j)' will sometimes be added. Reference character j indicates that the data is associated with the j-th sensing line La in the secondary scanning direction Y. The '(i)' or '(j)' will be omitted when it is not necessary to emphasize that the data is associated with individual sensing elements 11 or sensing lines La.

The direct current component correction unit 4 receives, as its inputs, the sensing data d3(*i*) and the sensing enable signal d2. The direct current component correction unit 4 outputs the corrected sensing data d4(*i*) from which the direct current component has been removed.

The direct current component correction unit 4 has the pattern presence/absence evaluation value generation unit 41, the correction data updating unit 42, the correction data subtraction unit 43, and the correction data line memory 44. The direct current component correction unit 4 may also have the delay unit 45.

The pattern presence/absence evaluation value generation unit 41 compares the sensing data d3(*i*) and correction data d44(*i*) and decides whether a pattern is present or absent. The sensing data d3(*i*) is sensing data obtained by each sensing element 11 (the i-th sensing element). The correction data d44(*i*) is data pertaining to the i-th sensing element 11, held in the correction data line memory 44. The pattern presence/absence evaluation value d41 represents the degree of inclusion of signal components corresponding to a magnetic pattern. The pattern presence/absence evaluation value generation unit 41 outputs the pattern presence/absence evaluation value d41. In the following description, the correction data line memory 44 is used to hold the correction data, but the memory need not be a line memory as long as it is a memory that stores data; what follows is an example.

The decision as to pattern presence or absence is a decision as to the degree of inclusion of signal components corresponding to a magnetic pattern. On the basis of the pattern presence/absence decision, the pattern presence/absence evaluation value generation unit 41 outputs an evaluation value (the pattern presence/absence evaluation value d41) representing the degree of inclusion of signal components corresponding to a magnetic pattern.

A value indicating a variation component of the sensing data d3 of each sensing element 11, for example, is used as the pattern presence/absence evaluation value d41. More specifically, as the value indicating the variation component of the sensing data of each sensing element 11, the difference of the data value of the sensing data d3 with respect to the correction data d44 or the amount of change in the data value is used. Alternatively, as the value indicating the variation component of the sensing data of the sensing element 11, a value obtained by summarizing the differences of the data values of the sensing data d3 with respect to the correction data d44 or the amounts of change in the data value is used. The value obtained by summarization is, for example, the mean value of the absolute values of the differences over the entire sensing line La. The 'difference' is a difference between two values.

The pattern presence/absence evaluation value generation unit 41 determines, for example, the mean value MAD(j) of the absolute values of the differences between the sensing data d3(*i*) and the correction data d44(*i*) of the same sensing element 11 for each sensing line La (the mean value thus determined will be referred to as the line mean value MAD(j) below). The pattern presence/absence evaluation value generation unit 41 outputs this line mean value MAD (j) as the pattern presence/absence evaluation value d41(*j*). The 'absolute value of the difference' is the absolute value of the difference between two values.

As described above, the absolute value of the difference between the sensing data d3(*i*) and the correction data d44(*i*) pertaining to the same sensing element 11 could be said to represent the amount of change of the sensing data d3(*i*) with respect to the correction data d44(*i*). The correction data d44(*i*) represents the direct current component included in the sensing data d3 for each sensing element 11, determined from the sensing results up to the preceding sensing line La. The 'preceding sensing line' is the sensing line La sensed one line before the sensing line La currently being sensed.

When the amount of change in the sensing data d3(*i*) with respect to the correction data d44(*i*) representing the direct current component is large, it can be inferred that many signal components corresponding to a magnetic pattern are included in the sensing line La currently being sensed. Conversely, when the amount of change in the sensing data d3(*i*) with respect to the correction data d44(*i*) representing the direct current component is small, it can be inferred that only a few signal components corresponding to a magnetic pattern are included in the sensing line La currently being sensed.

The correction data updating unit 42 takes a weighted sum of the sensing data d3(*i*) and the correction data d44(*i*). The correction data updating unit 42 takes this weighted sum on the basis of the pattern presence/absence evaluation value d41(*j*) and the sensing enable signal d2. The pattern presence/absence evaluation value d41(*j*) is the value output by the pattern presence/absence evaluation value generation unit 41. The correction data updating unit 42 outputs the result of this addition as new correction data d42(*i*). The 'new correction data' is updated correction data.

The correction data updating unit 42 takes the weighted sum of the sensing data d3(*i*) and the correction data d44(*i*) when the sensing enable signal d2 is '1'. The correction data updating unit 42 obtains the updated correction data d42(*i*). When, on the basis of the pattern presence/absence evaluation value d41(*j*), there are many signal components corresponding to the magnetic pattern, the correction data updating unit 42 increases the weight of the correction data d44. When there are few signal components corresponding to the magnetic pattern, the correction data updating unit 42 increases the weight of the sensing data d3(*i*).

The interval in which the sensing enable signal d2 is '1' is the interval in which the magnetic pattern sensing is valid. The pattern presence/absence evaluation value d41(*j*) is the result of the decision output by the pattern presence/absence evaluation value generation unit 41.

When the sensing enable signal d2 is '0' (the interval in which the magnetic pattern sensing is invalid), the correction data updating unit 42 increases the weight of the sensing data d3(*i*) regardless of the pattern presence/absence evaluation value d41(*j*) of the pattern presence/absence evaluation value generation unit 41. The pattern presence/absence evaluation value d41(*j*) is the result of the pattern presence/absence decision of the pattern presence/absence evaluation value generation unit 41.

The correction data updating unit 42 takes a weighted sum of the weighted sensing data d3(*i*) and the correction data d44(*i*). The correction data updating unit 42 thereby obtains the updated correction data d42(*i*).

Figure 5:
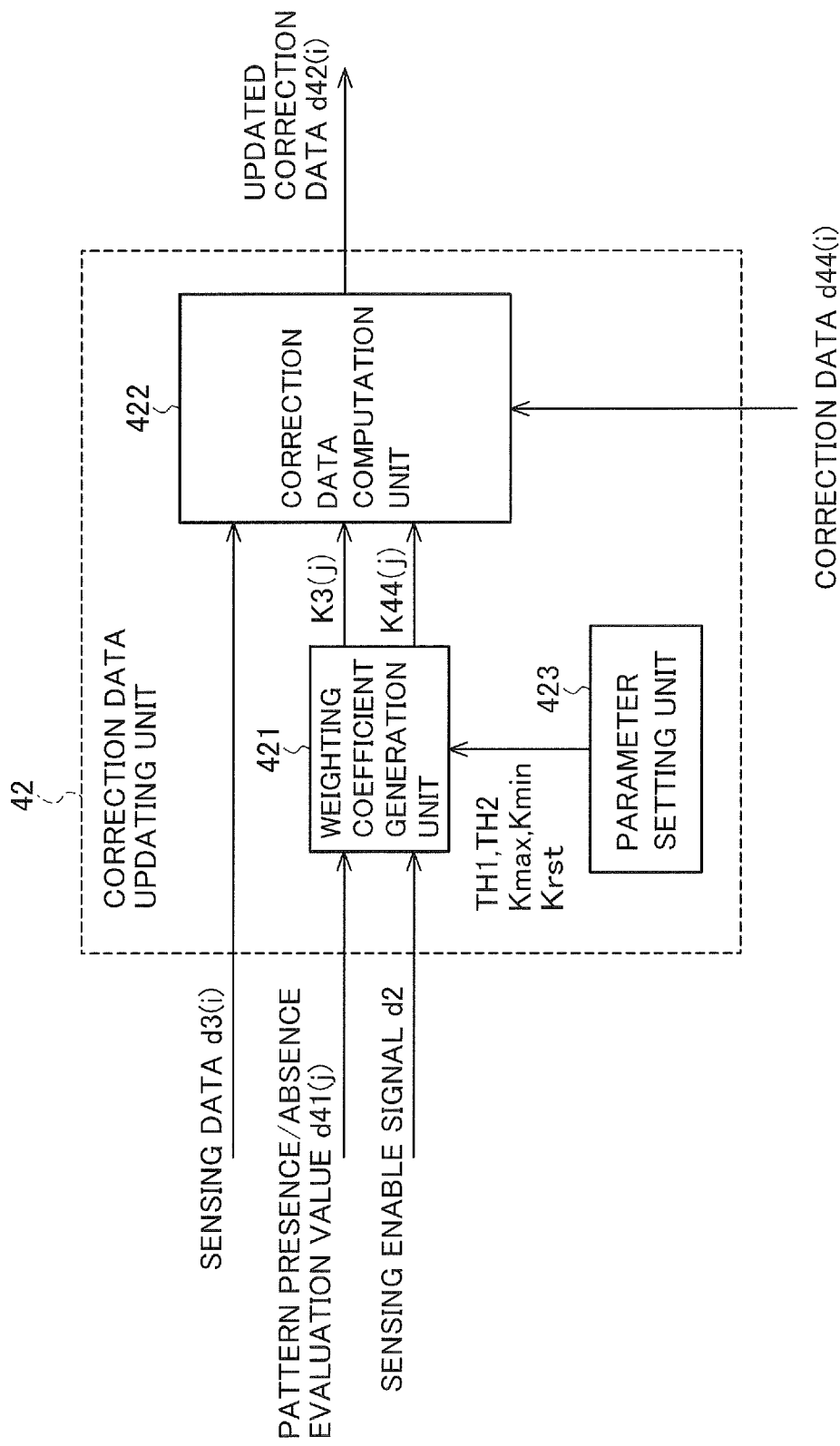
FIG. 5 is a block diagram showing an example of the structure of the correction data updating unit 42 in FIG. 1.

FIG. 5 is a block diagram showing an example of the structure of the correction data updating unit 42.

The correction data updating unit 42 has a weighting coefficient generation unit 421, a correction data computation unit 422, and a parameter setting unit 423.

The weighting coefficient generation unit 421 receives, as its inputs, the pattern presence/absence evaluation value d41(*j*) and the sensing enable signal d2. The weighting coefficient generation unit 421 outputs a sensing data weighting coefficient K3(*j*) and a correction data weighting coefficient K44(*j*) to the correction data computation unit 422.

When the sensing enable signal d2 is '1' (the interval in which the magnetic pattern sensing is valid), the weighting coefficient generation unit 421 calculates the correction data weighting coefficient K44(j) from the relation shown in the following mathematical expression (1).

[Mathematical Expression 1]

$$K(44)(j) = \begin{cases} K\min & (d41(j) < TH1) \\ \dfrac{K\max - K\min}{TH2 - TH1} \times d41(j) + \\ \dfrac{K\min \times TH2 - K\max \times TH1}{TH2 - TH1} & (TH1 \leq d41(j) \leq TH2) \\ K\max & TH2 < (d41(j)) \end{cases} \quad (1)$$

The following definitions apply here in expression (1).
TH1 is a first threshold value.
TH2 is a second threshold value.
Kmax is the maximum value of the correction data weighting coefficient.
Kmin is the minimum value of the correction data weighting coefficient.
The first threshold value TH1 and the second threshold value TH2 satisfy the relation TH1≤TH2.
The maximum value Kmax of the correction data weighting coefficient and the minimum value Kmin of the correction data weighting coefficient satisfy the relation 0≤Kmin≤Kmax≤1.
That is, when the pattern presence/absence evaluation value is less than the first threshold value, the weighting coefficient generation unit 421 outputs the minimum value of the correction data weighting coefficient as the correction data weighting coefficient.

When the pattern presence/absence evaluation value is greater than the second threshold value, the weighting coefficient generation unit 421 outputs the maximum value of the correction data weighting coefficient as the correction data weighting coefficient.

When the pattern presence/absence evaluation value is equal to or greater than the first threshold value and equal to or less than the second threshold value, the weighting coefficient generation unit 421 outputs, as the correction data weighting coefficient, a value that increases monotonically with respect to the pattern presence/absence evaluation value in the interval from the minimum value of the correction data weighting coefficient to the maximum value of the correction data weighting coefficient.

Figure 6:
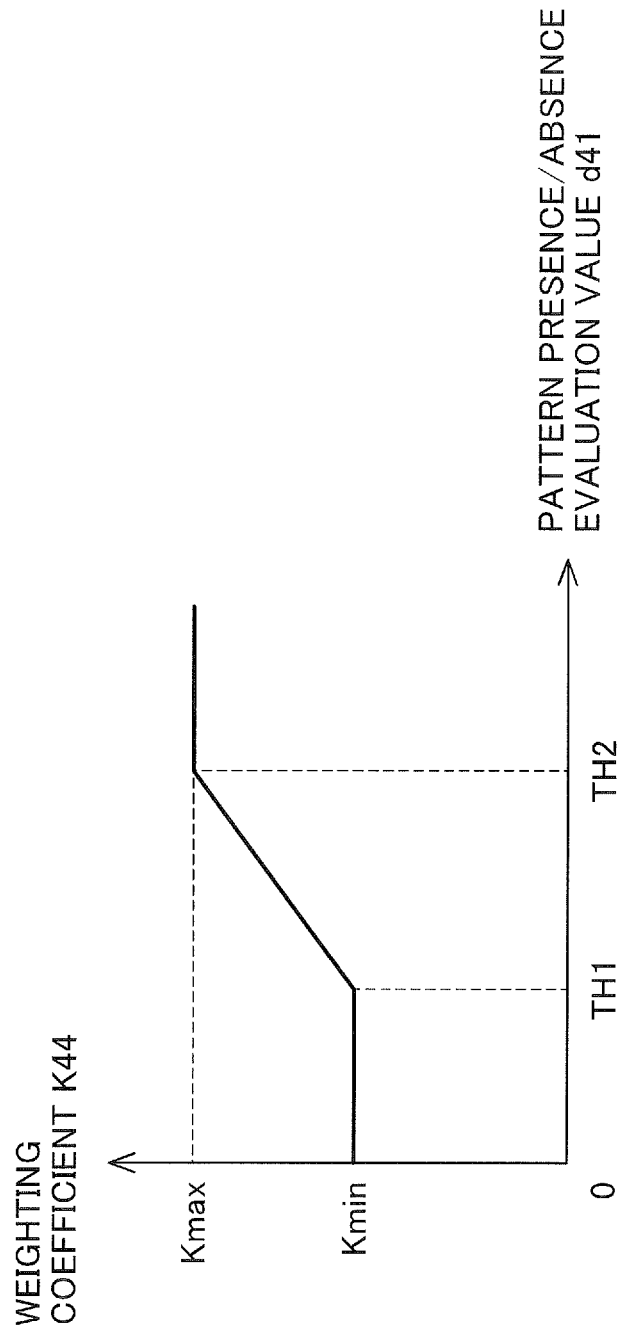
FIG. 6 illustrates the relation between the input and the output of the weighting coefficient generation unit 421 in FIG. 5.

The relation in expression (1) is shown in FIG. 6. FIG. 6 illustrates the relation between the input and the output of the weighting coefficient generation unit 421. The horizontal axis represents the pattern presence/absence evaluation value d41. The vertical axis represents the weighting coefficient K44.

The operation of the weighting coefficient generation unit 421 illustrated by expression (1) and FIG. 6 will now be described. The interval in which the sensing enable signal d2 is '1' is the interval in which the magnetic pattern sensing is performed (the valid interval of the magnetic pattern sensing). The interval in which the sensing enable signal d2 is '0' is the interval in which the magnetic pattern sensing is not performed (the invalid interval of the magnetic pattern sensing).

First the operation when the sensing enable signal d2 is '1' will be described.
In the operation of the weighting coefficient generation unit 421, there are three cases, as follows.

As the first case, when the pattern presence/absence evaluation value d41(j) is less than the first threshold value TH1, the weighting coefficient generation unit 421 finds that there is no magnetic pattern. The weighting coefficient generation unit 421 outputs the minimum value Kmin of the correction data weighting coefficient as the correction data weighting coefficient K44(j). 'No magnetic pattern' means that negligibly few signal components corresponding to a magnetic pattern are included.

As the second case, when the pattern presence/absence evaluation value d41(j) is greater than the second threshold value TH2, the weighting coefficient generation unit 421 finds that a magnetic pattern is present. The weighting coefficient generation unit 421 outputs the maximum value Kmax of the correction data weighting coefficient as the correction data weighting coefficient K44(j). 'A magnetic pattern is present' means that many signal components corresponding to a magnetic pattern are included.

As the third case, when the pattern presence/absence evaluation value d41(j) is equal to or greater than the first threshold value TH1 and equal to or less than the second threshold value TH2, the weighting coefficient generation unit 421 outputs a value determined by a characteristic that increases monotonically from the minimum value Kmin to the maximum value Kmax of the correction data weighting coefficient as the correction data weighting coefficient K44(j).

Next the operation when the sensing enable signal d2 is '0' will be described.
The weighting coefficient generation unit 421 calculates the correction data weighting coefficient K44(j) from the relation indicated by the following expression (2).

$$K44(j) = Krst \quad (2)$$

Here, Krst is a parameter indicating the value of the correction data weighting coefficient K44(j) during invalid magnetic pattern sensing intervals. Krst satisfies the relation 0≤Krst≤Kmin.

As shown by expression (2), when the sensing enable signal d2 is '0', the weighting coefficient generation unit 421 outputs the correction data weighting coefficient K44(j) without regard to the value of the pattern presence/absence evaluation value d41(j). The value of the correction data weighting coefficient K44(j) at this time is the value Krst. The value Krst is equal to or less than the value Kmin. The sensing enable signal d2 is '0' in intervals in which the magnetic pattern sensing is invalid.

The weighting coefficient generation unit 421 also calculates the sensing data weighting coefficient K3(j) that sums to 1 when added to the correction data weighting coefficient K44(j), from the relation shown by expression (3)

$$K3(j) = 1 - K44(j) \quad (3)$$

As described above, the weighting coefficient generation unit 421 generates the correction data weighting coefficient K44(j) that increases when the pattern presence/absence evaluation value d41(j) is large, and the sensing data weighting coefficient K3(j) whose sum with the correction data weighting coefficient K44(j) is 1.

Next, the correction data computation unit 422 takes a weighted sum of the sensing data d3(i) and the correction data d44(i) according to the expression (4) below. The correction data computation unit 422 then outputs the updated correction data d42(i). In taking the weighted sum, the correction data computation unit 422 uses the weighting coefficients K3(j) and K44(j).

$$d42(i) = K44(j) \times d44(i) + K3(j) \times d3(i) \quad (4)$$

As shown in the above expression, the correction data computation unit 422 multiplies the correction data $d44(i)$ by the correction data weighting coefficient $K44(j)$, multiplies the sensing data $d3(i)$ by the sensing data weighting coefficient $K3(j)$, and performs addition (weighted addition) on the multiplication results.

The parameter setting unit 423 holds the parameters TH1, TH2, Kmax, Kmin, and Krst, which are set by the user in advance. The parameter setting unit 423 supplies the parameters TH1, TH2, Kmax, Kmin, and Krst to the weighting coefficient generation unit 421. Setting of the parameters TH1, TH2, Kmax, Kmin, and Krst is not limited to the user. They may be set by the manufacturer on the production line, or elsewhere. That is, the parameters TH1, TH2, Kmax, and Krst are set from the outside.

The first threshold TH1 and the second threshold TH2 are preset in consideration of the signal-to-noise ratio of the information reading apparatus. The purpose of this is to do the utmost to prevent the occurrence of incorrect signal decisions or failure to detect the signal because of noise.

The maximum value Kmax of the correction data weighting coefficient is preset to 1 or a value close to 1. The purpose of this is to give a large weight to the correction data $d44(i)$ in the updating of the correction data when it is decided that signal components corresponding to a magnetic pattern are present. Here, 'signal components are present' means that sufficiently many signal components are present.

The minimum value Kmin of the correction data weighting coefficient is preset in consideration of the rapidity of changes in the sensing signal level and the frequency characteristic of the signal. The purpose of this is to ensure that while changes in the sensing signal level are reflected in the updating of the correction data when it is decided that signal components corresponding to a magnetic pattern are absent, the low frequency components of the sensing signal are not removed. Here, 'signal components are absent' means that negligibly few signal components are present.

The correction data weighting coefficient Krst in the invalid intervals of the magnetic pattern sensing is preset to a value equal to or less than Kmin. The purpose of this is to give the sensing data $d3(i)$ greater weight over the correction data.

The apparatus is configured to enable these parameters to be updated from the outside by, for example, the user.

The correction data updating unit 42 outputs the updated correction data $d42(i)$ by means of the above configuration.

The correction data subtraction unit 43 subtracts the correction data $d42(i)$ updated by the correction data updating unit 42 from the sensing data $d3(i)$. The correction data subtraction unit 43 outputs the result of this subtraction as corrected sensing data $d43(i)$.

The correction data line memory 44 holds the updated correction data $d42(i)$ for one sensing line La. The updated correction data $d42(i)$ is data that have been updated by the correction data updating unit 42. The updated correction data $d42(i)$ held in the correction data line memory 44 are used in the processing of the next sensing line La by the pattern presence/absence evaluation value generation unit 41 and the correction data updating unit 42 as the correction data $d44(i)$.

By means of the above configuration, the direct current component correction unit 4 outputs the corrected sensing data $d43(i)$ as the direct current component corrected sensing data $d4(i)$.

The direct current component corrected sensing data $d4(i)$ output from the direct current component correction unit 4 are supplied to the signal conditioning unit 5. The signal conditioning unit 5 includes, for example, a gain adjustment circuit that adjusts the gain or a noise reduction circuit that performs noise reduction. The signal conditioning unit 5 carries out signal conditioning such as gain adjustment or noise reduction on the corrected sensing data $d4(i)$. Then the signal conditioning unit 5 outputs the conditioned sensing data $d5(i)$.

The operation of the direct current component correction unit 4 in the information reading apparatus 100 according to the first embodiment will be described below with reference to FIG. 7.

Figure 7:
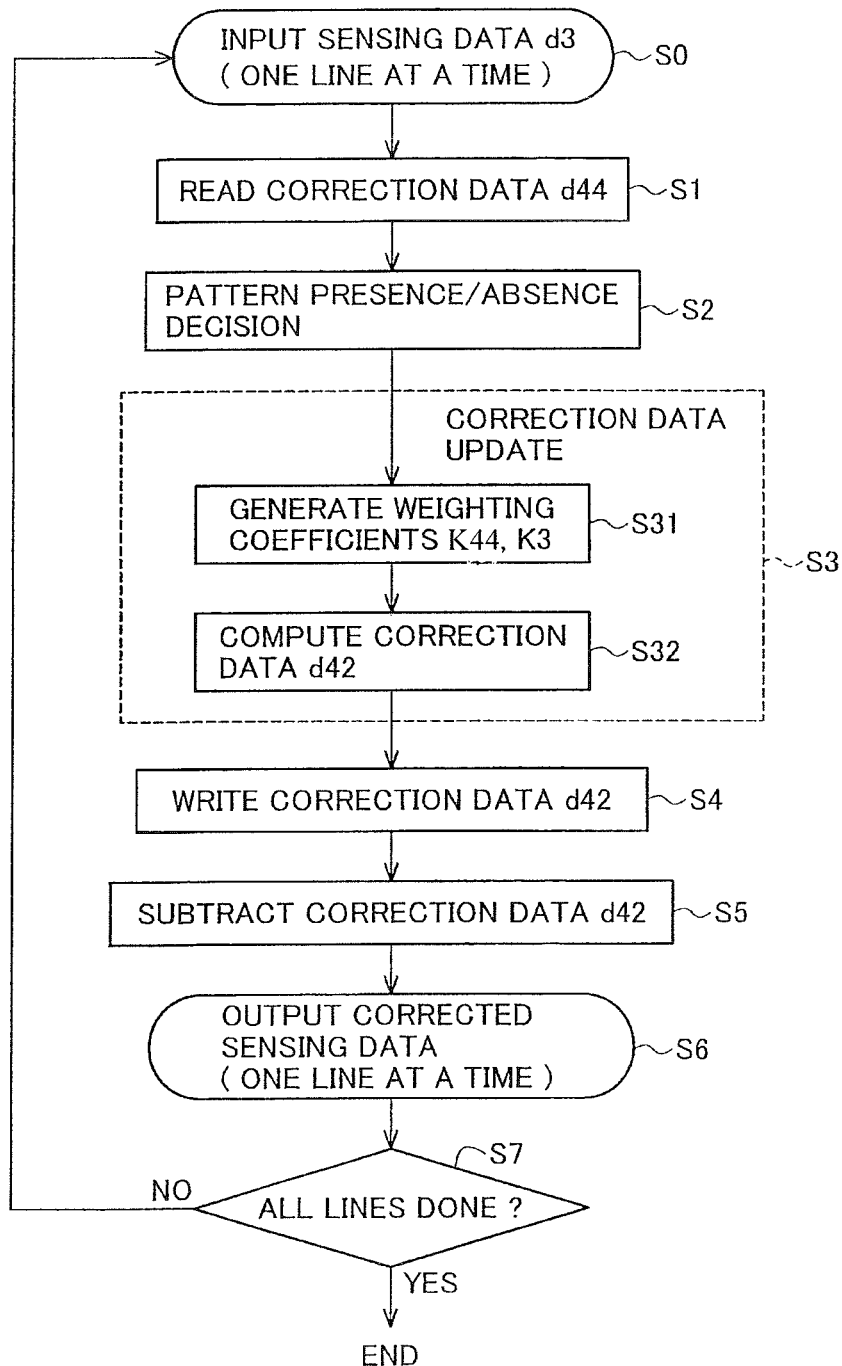
FIG. 7 is a flowchart illustrating the operation of the direct current component correction unit 4 in FIG. 1.

FIG. 7 is a flowchart illustrating the operation of the direct current component correction unit 4.

The processing by the direct current component correction unit 4 is carried out one sensing line La at a time. First, the sensing data $d3(i)$ for one sensing line La is input in a step S0.

In a correction data reading step S1, the correction data $d44(i)$ for one sensing line La held in the correction data line memory 44 is read.

Next, in a pattern presence/absence decision step S2, the line mean value MAD(j) of the absolute values of the differences between the sensing data $d3(i)$ and the correction data $d44(i)$ for the same sensing elements 11 is determined. In the pattern presence/absence decision step S2, this line mean value MAD(j) is output as the pattern presence/absence evaluation value $d41(j)$ of the sensing line La that is undergoing signal processing. The 'line mean value' is a value obtained by dividing a sum of values based on the outputs of the sensing elements arranged in a line, by the number of the sensing elements. That is, it is the mean value of the values sensed in the sensing line La.

Next, in a correction data updating step S3, the correction data $d44(i)$ based on the pattern presence/absence evaluation value $d41(j)$ are updated. This update is performed for all of the sensing elements in the sensing line La that is undergoing signal processing.

In the correction data updating step S3, first, the weighting coefficients $K3(j)$ and $K44(j)$ are generated based on the pattern presence/absence evaluation value $d41(j)$ and the sensing enable signal d2 in a weighting coefficient generation step S31.

Figure 8:
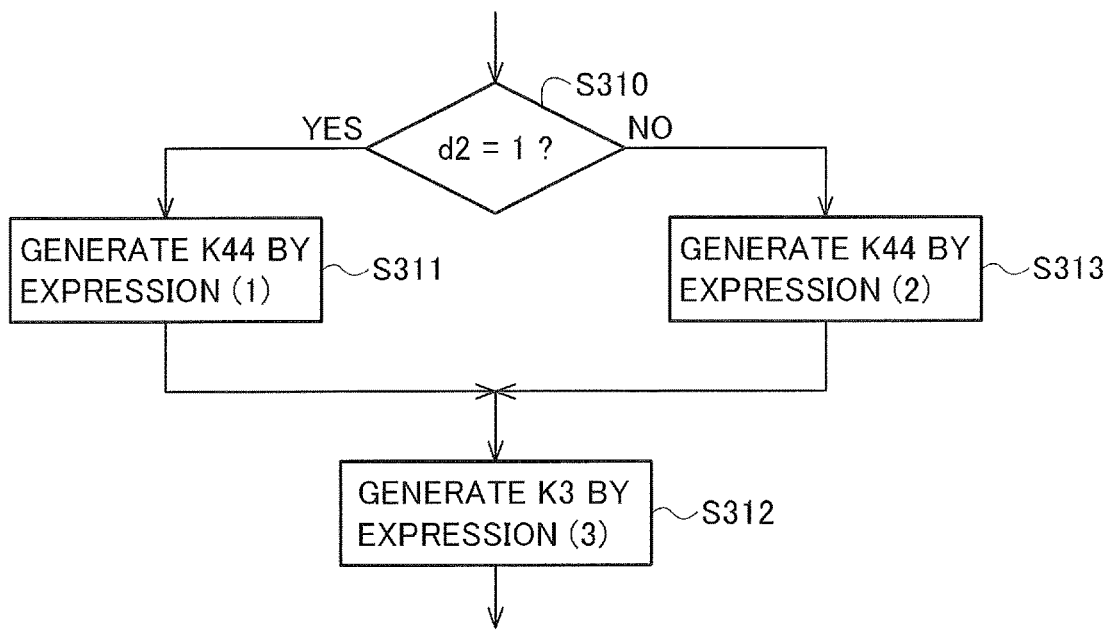
FIG. 8 is a flowchart illustrating details of the weighting coefficient generation step S31 in FIG. 7.
Figure 9A:
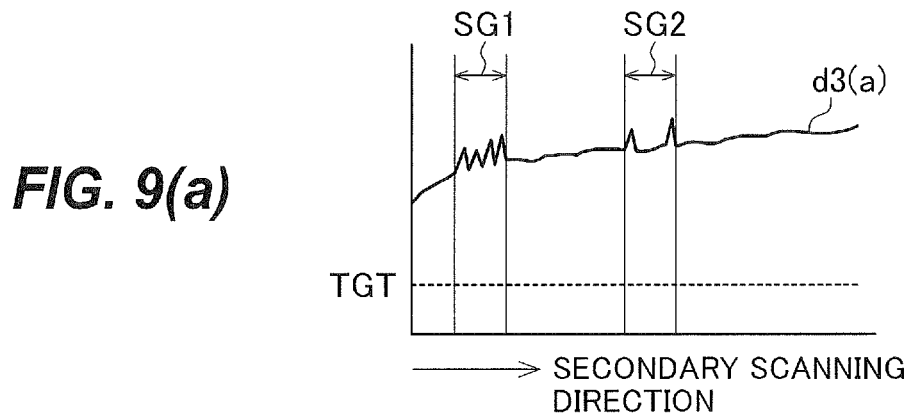
FIGS. 9(a) to 9(d) show other examples of changes, in the secondary scanning direction, in the signals of the individual units of the direct current component correction unit 4 in FIG. 1.
Figure 9B:
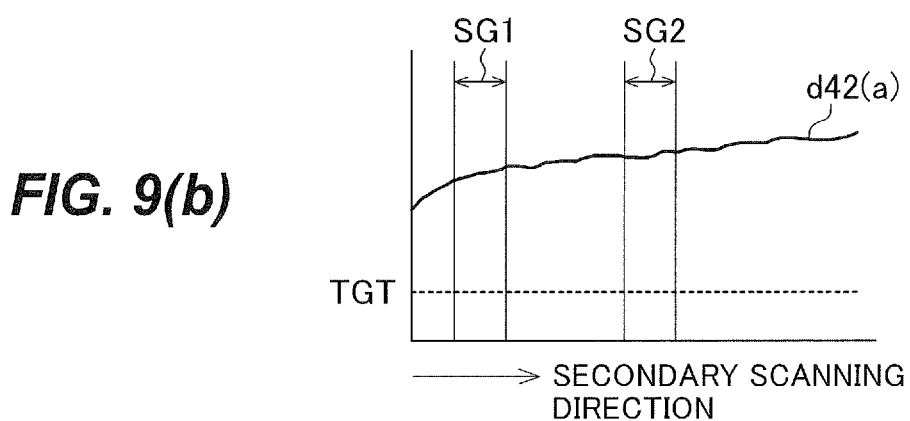
Figure 9C:
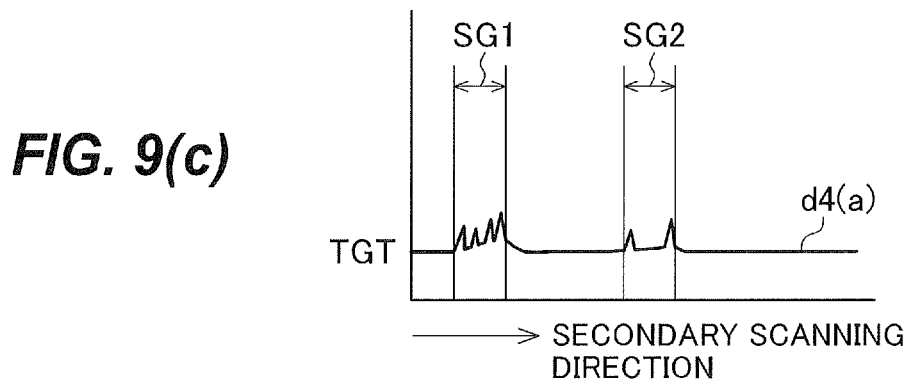
Figure 9D:
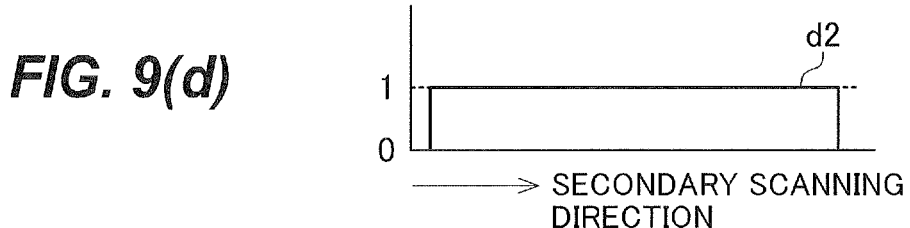
Figure 10A:
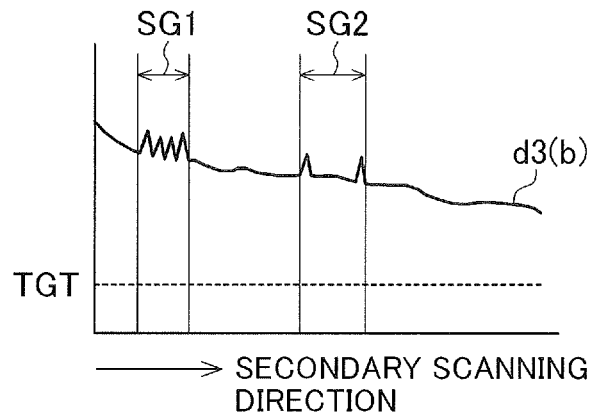
FIGS. 10(a) to 10(d) show other examples of changes, in the secondary scanning direction, in the signals of the individual units of the direct current component correction unit 4 in FIG. 1.
Figure 10B:
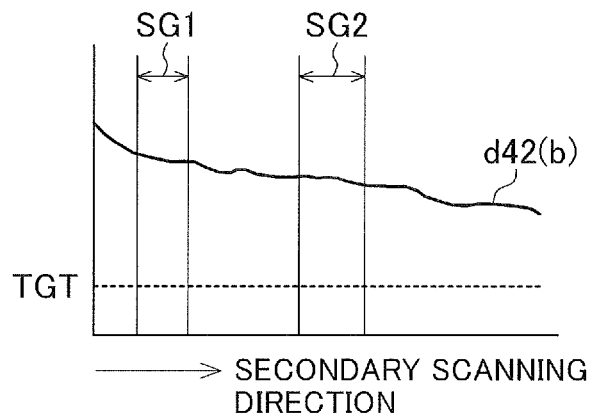
Figure 10C:
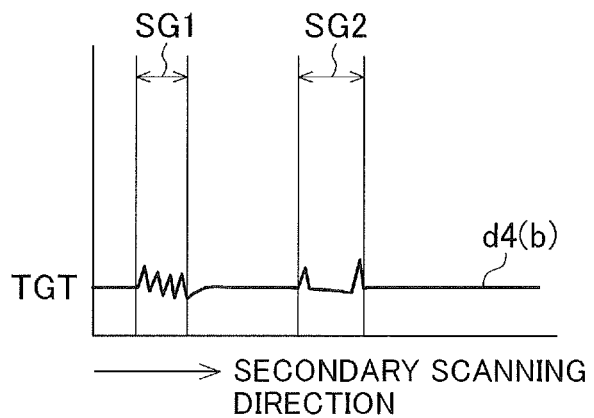
Figure 10D:
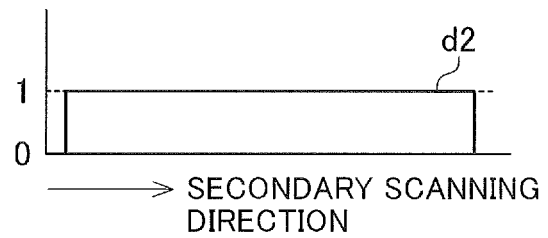

FIG. 8 is a flowchart illustrating details of the weighting coefficient generation step S31.

In a step S310, the sensing enable signal d2 of the sensing line La undergoing signal processing is checked. If, in the step S310, the sensing enable signal d2 of the sensing line La undergoing signal processing is '1' (a valid magnetic pattern sensing interval; Yes in the conditional branch in the step S310), the process proceeds to a step S311. In the step S311, the weighting coefficient $K44(j)$ is generated from the relational expression (expression (1)) dependent on the pattern presence/absence evaluation value $d41(j)$, and the process proceeds to a step S312. Next, in the step S312, the weighting coefficient $K3(j)$ is generated from expression (3).

Conversely, if the sensing enable signal d2 of the sensing line La undergoing signal processing is '0' (an invalid magnetic pattern sensing interval; No in the conditional branch in the step S310), the weighting coefficient $K44(j)$ is generated from the relational expression (expression (2)) that does not depend on the pattern presence/absence evaluation value $d41(j)$, and the process proceeds to the step S312. Then in the step S312, the weighting coefficient $K3(j)$ is generated from expression (3).

The description now returns to FIG. 7.

In a correction data computation step S32, the generated weighting coefficients $K3(j)$ and $K44(j)$ are used to take a weighted sum of the sensing data d3($i$) and the correction data d44($i$) according to expression (4). The value of the weighted sum is output as the updated correction data d42($i$).

Here, the weighted sum is taken of the sensing data d3($i$) and the correction data d44($i$) for the same sensing element 11. The processing of one sensing line La in the correction data computation step S32 is completed by taking the above weighted sum for all sensing elements 11 in one sensing line La.

After the correction data for one sensing line La have been updated in the correction data update step S3, the updated correction data d42($i$) is written into the correction data line memory 44 in a correction data writing step S4.

Next, the updated correction data d42($i$) is subtracted from the sensing data d3($i$) in a step S5. The corrected sensing data d4($i$) is obtained by this subtraction in the step S5. The subtraction is performed here on the sensing data d3($i$) and the updated correction data d42($i$) for the same sensing element 11.

Next, the corrected sensing data d4($i$) obtained in the step S5 is output in a step S6. The processing in the step S6 is also carried out one sensing line La at a time. The corrected sensing data for one sensing line La is output in the step S6. 'One sensing line La at a time' means for all sensing elements in the sensing line La undergoing signal processing.

When the processing of one sensing line La is completed, a return is made to the step S0 and the processing of the next sensing line La begins. When similar processing has been completed for all sensing lines La (Yes in the conditional branch in a step S7), the process is terminated.

The delay unit 45 indicated by the dashed line in FIG. 1 may further be provided.

In FIG. 1, the delay unit 45 (indicated by the dashed line) is located on the input side of the correction data subtraction unit 43. That is, the sensing data d3($i$) may be input to the correction data subtraction unit 43 through the delay unit 45. The purpose of this is to subtract the updated correction data d42($i$) from the sensing data d3($i$) that was used to update them. In this case, the delay time due to the delay unit 45 is equivalent to the time needed for the processing done by the pattern presence/absence evaluation value generation unit 41 and the correction data updating unit 42.

The above is a description of the operation of the direct current component correction unit 4 in the information reading apparatus 100 according to the first embodiment of the present invention.

Next, the effects due to the direct current component correction unit 4 in the information reading apparatus 100 according to the first embodiment of the present invention will be described by use of FIGS. 9($a$) to 9($d$) and 10($a$) to 10($d$).

FIGS. 9($a$) to 9($d$) and 10($a$) to 10($d$) show profiles of data for different lines MSa and MSb extending in the secondary scanning direction Y on the paper currency 13 in FIG. 2. In each of FIGS. 9($a$) to 9($d$) and 10($a$) to 10($d$), the horizontal axis indicates the secondary scanning direction Y and the vertical axis indicates the signal value.

FIGS. 9($a$) and 10($a$) show the sensing data d3($i$) ($i$=a, b) for the respective lines MSa, MSb in the secondary scanning direction Y. As shown in FIG. 2, the sensing element 11 positioned on the line MSa is a different sensing element 11 from the sensing element 11 positioned on the line MSb. That is, FIGS. 9($a$) and 10($a$) represent the sensing data d3 of different sensing elements 11, in correspondence to position in the secondary scanning direction Y. These sensing data d3($i$) are respective sequences of the sensing data d3($i$) read by the different sensing elements 11($a$), 11($b$) in the line sensor 12.

FIGS. 9($b$) and 10($b$) show the updated correction data d42($i$) ($i$=a, b) for the lines MSa and MSb in the secondary scanning direction Y.

FIGS. 9($c$) and 10($c$) show the direct current component corrected sensing data d4($i$) ($i$=a, b) for the lines MSa and MSb in the secondary scanning direction Y.

FIGS. 9($d$) and 10($d$) show the sensing enable signal d2.

In the lines MSa and MSb in the secondary scanning direction Y shown in FIG. 2, there are the regions MG1 and MG2 having magnetic patterns due to printing with magnetic ink on the paper currency 13. As shown in FIGS. 9($a$) and 10($a$), signal components corresponding to magnetic patterns appear at positions SG1 and SG2 corresponding to these regions.

In the line MSa in the secondary scanning direction Y, the level of the sensing signal tends to increase gradually from one end to the other. In the line MSb in the secondary scanning direction Y, the level of the sensing signal tends to decrease gradually from one end to the other.

In FIG. 2, 'from one end to the other' means 'from the top end to the bottom end'. In FIGS. 9($a$) to 9($d$) and 10($a$) to 10($d$), 'from one end to the other' means 'from the left end to the right end'.

The level of the sensing signal from a sensing element 11 (a magnetic sensor element) may vary because of temperature and other factors during the interval in which one piece of paper currency is read. The way in which the level of the sensing signal varies may also differ from one sensing element 11 to another. Therefore, the non-uniformity in the sensing signal level in the primary scanning direction X appears as stripe noise in the secondary scanning direction Y in the sensing data d3($i$).

The offset correction method shown in patent reference 1 calculates an offset correction value only in the intervals between one piece of paper currency and another. That is, the offset correction method shown in patent reference 1 calculates an offset correction value in the invalid magnetic pattern sensing intervals. Therefore, when the output level varies during the reading of one piece of paper currency, even if the non-uniformity in the sensing signal level in the primary scanning direction X is suppressed near the leading edge of the paper currency, output levels that are not uniform in the primary scanning direction X may occur near the trailing edge of the paper currency.

Here 'near the leading edge of the paper currency' denotes the region of a piece of paper currency in which reading is begun. 'Near the trailing edge of the paper currency' denotes the region of a piece of paper currency in which reading is terminated. That is, there has been the problem of lowered paper currency identification accuracy because the offset correction method in patent reference 1 is unable to fully eliminate stripe noise.

The present invention seeks to solve this problem by updating the offset correction value during the valid magnetic pattern sensing intervals, as described above. The offset correction value is weighted according to the presence or absence of signal components corresponding to a magnetic pattern.

This point will be explained below.

The updated correction data d42($i$) shown in FIGS. 9($b$) and 10($b$) represents the result of determining the direct current component of the sensing data on the basis of the sensing data d3($i$) from the start of reading up to the sensing line La (a line in the primary scanning direction X) one line before.

The direct current component does not change greatly between the sensing line La in the primary scanning direction X one line before and the current sensing line La in the primary scanning direction X. The direct current component of the sensing data d3($i$) is therefore the same in the sensing line La in the primary scanning direction X one line before and the current sensing line La in the primary scanning direction X. Here, the 'direct current component' is the value obtained by subtracting the signal components corresponding to the magnetic pattern from the sensing data d3($i$) of the current sensing line La in the primary scanning direction X.

In the direct current component correction unit 4 in the information reading apparatus 100 in the first embodiment, when the sensing enable signal d2 is '0' (in an invalid magnetic pattern sensing interval), the weighting of the sensing data d3($i$) in the generation of the updated correction data d42($i$) is increased. At the starting point of the reading of the paper currency, the value of the updated correction data d42($i$) therefore agrees with the value of the sensing data d3($i$).

There are times when it is already known, from an external signal such as the sensing enable signal d2, that there are no signal components corresponding to a magnetic pattern. At these times the correction data updating unit 42 increases the weighting of the sensing data d3($i$), regardless of the pattern presence/absence evaluation value d41($j$) from the pattern presence/absence evaluation value generation unit 41. This improves the tracking characteristics of the updated correction data d42($i$) with respect to the sensing data d3. The correction data d44($i$) can also be initialized in the brief time between two pieces of paper currency 13.

On entry into an interval in which the sensing enable signal d2 is '1' (a valid magnetic pattern sensing interval), the direct current component correction unit 4 determines the weighting coefficients according to the pattern presence/absence evaluation value d41($j$) from the pattern presence/absence evaluation value generation unit 41. The pattern presence/absence evaluation value d41($j$) indicates the degree of inclusion of a magnetic pattern in the sensing data d3($i$). The direct current component correction unit 4 carries out an update of the correction data, using the weighting coefficients K3 and K44 having been determined.

When no magnetic pattern is present, the direct current component correction unit 4 increases the weighting of the sensing data d3($i$) and takes a weighted sum of the sensing data d3($i$) and the correction data d44($i$). Then it further updates the updated correction data d42($i$). The updated correction data d42($i$) accordingly approach the sensing data d3($i$).

When a magnetic pattern is present, however, the direct current component correction unit 4 increases the weighting of the correction data d44($i$) and takes a weighted sum of the sensing data d3($i$) and the correction data d44($i$). Then it further updates the updated correction data d42($i$). The updated correction data d42($i$) accordingly approach the correction data d44($i$) before the correction. This means that the correction data d44($i$) determined on the basis of the sensing data d3($i$) in previous sensing lines La are maintained.

In cases intermediate between a situation in which 'a magnetic pattern is present' and a situation in which 'there is no magnetic pattern', the direct current component correction unit 4 determines the weighting coefficients K3($j$) and K44($j$) according to the pattern presence/absence evaluation value d41($j$). "Cases intermediate between a situation in which 'a magnetic pattern is present' and a situation in which 'there is no magnetic pattern'" are cases in which the line mean value MAD($j$) of the absolute values is equal to or greater than threshold value TH1 and equal to or less than threshold value TH2. 'According to the pattern presence/absence evaluation value d41($j$)' means 'according to the degree of inclusion of signal components corresponding to a magnetic pattern'. The direct current component correction unit 4 uses the determined weighting coefficients K3, K44 to update the updated correction data d42($i$).

A one-bit signal, for example, can express only one of two states.

If the pattern presence/absence evaluation value d41($j$) were to be just one bit, for example, it could only express one of 'magnetic pattern present' or 'magnetic pattern absent'. In the first embodiment, the pattern presence/absence evaluation value d41($j$) is not a value (a one-bit value) that can indicate only either 'magnetic pattern present' or 'magnetic pattern absent'. A value that varies continuously according to the degree of inclusion of signal components corresponding to a magnetic pattern is used as the pattern presence/absence evaluation value d41($j$). The weighting coefficient generation unit 421 is adapted to generate the weighting coefficients K44($j$), K3($j$) that vary continuously according to the pattern presence/absence evaluation value d41($j$). The direct current component correction unit 4 can thereby perform a suitable update according to the degree of inclusion of signal components corresponding to a magnetic pattern.

When there is nothing but either 'magnetic pattern present' or 'magnetic pattern absent', at locations of switchovers between the two, step edges may occur in the two-dimensional image represented by the corrected sensing data d4. Such step edges tend to be avoided in the first embodiment by processing according to the degree of pattern presence/absence.

The direct current component corrected sensing data d4($i$) shown in FIG. 9($c$) is obtained by subtracting the updated correction data d42($i$) shown in FIG. 9($b$) from the sensing data d3($i$) shown in FIG. 9($a$).

Similarly, the direct current component corrected sensing data d4($i$) shown in FIG. 10($c$) is obtained by subtracting the updated correction data d42($i$) shown in FIG. 10($b$) from the sensing data d3($i$) shown in FIG. 10($a$).

As shown in FIGS. 9($c$) and 10($c$), signal components which correspond to the magnetic patterns in the regions MG1 and MG2 and which are present in the segments SG1 and SG2 are not lost in the direct current component corrected sensing data d4($i$).

As also shown in FIGS. 9($c$) and 10($c$), in places (other than SG1 and SG2) where signal components corresponding to the magnetic patterns are absent, the corrected sensing data d4($i$) are aligned at the level of the target value TGT.

The direct current component correction unit 4 thereby suppresses non-uniformity in the level of the sensing signal in the primary scanning direction X in places where signal components corresponding to a magnetic pattern are absent, even when the level of the sensing signal varies within the reading interval of one piece of paper currency. The information reading apparatus 100 according to the first embodiment of the present invention can thereby reduce stripe noise in the secondary scanning direction Y.

As described above, according to the first embodiment of the invention, correction data can be updated within the interval in which one piece of paper currency is being read. The first embodiment of the present invention can therefore reduce the effect of variations in the level of the sensing signal that occur in the interval while each object that undergoes sensing is being read. The first embodiment of the present invention can also obtain the sensing data in which the non-uniformity in the level is adequately corrected.

The signal processing device 4 has the pattern presence/absence evaluation value generation unit 41, the correction data updating unit 42, and the correction data subtraction unit 43.

On the basis of the sensing data d3 including signal components of the object being sensed, obtained by sequential sensing of the object sensed by the sensing elements 11, the pattern presence/absence evaluation value generation unit 41 calculates the degree of inclusion of the signal components in the sensing data d3.

The correction data updating unit 42 generates updated correction data d42 by taking a weighted sum of the sensing data d3 and the correction data d44 representing a direct current component of the sensing elements, giving greater weight to the correction data d44 as the degree increases and giving greater weight to the sensing data d3 as the degree decreases.

The correction data subtraction unit 43 subtracts the updated correction data d42 from the sensing data d3 to generate the corrected sensing data.

Second Embodiment

In the first embodiment, the pattern presence/absence evaluation value generation unit 41 uses the line mean value MAD(j) of the absolute values of the differences between the sensing data d3(i) and the correction data d44(i) of identical sensing elements 11 as the pattern presence/absence evaluation value d41(j). In the second embodiment, the pattern presence/absence evaluation value d41(j) is determined by a different method.

Component elements that are the same as in the information reading apparatus 100 in the first embodiment will be given the same reference characters and descriptions will be omitted. The component elements that are the same as in the first embodiment are the sensing data generation unit 10 (the pattern sensing unit 1 and the A/D conversion unit 3), the sensing enable generation unit 2, the correction data updating unit 42, the correction data line memory 44, the correction data subtraction unit 43, the delay unit 45, the system control unit 6, and the signal conditioning unit 5. The same reference characters 100 as in the first embodiment will also be used in describing the information reading apparatus.

In the second embodiment, the pattern presence/absence evaluation value generation unit 41 uses, for example, the in-line standard deviation s(j) of the differences of the sensing data d3(i) and the correction data d44(i) of identical sensing elements 11 as the pattern presence/absence evaluation value d41(j).

The in-line standard deviation s(j) can be determined from the expression (5) below.
[Mathematical Expression 2]

$$s(j) = \sqrt{\frac{\sum_{i=1}^{I}(d(3i) - d44(i))^2}{I}} \quad (5)$$

The following definitions apply in expression (5).

d3(i) is the sensing data for the i-th sensing element 11 in each sensing line La.

d44(i) is the correction data for the same i-th sensing element 11.

I is the total number of sensing elements 11 in the sensing line La.

In the above case, before the information reading apparatus 100 reads information, the pattern presence/absence evaluation value generation unit 41 calculates the standard deviation of the noise. The pattern presence/absence evaluation value generation unit 41 uses the calculated standard deviation of the noise as the above first threshold value TH1.

In the information reading operation of the information reading apparatus 100, when the in-line standard deviation s(j) is equal to or greater than the first threshold TH1, it can be inferred that many signal components corresponding to a magnetic pattern are included in this sensing line La.

When the in-line standard deviation s(j) is less than the first threshold TH1 in the information reading operation of the information reading apparatus 100, it can be inferred that few signal components corresponding to a magnetic pattern are included in this sensing line La.

The standard deviation is often used to evaluate noise levels. Calculation of the in-line standard deviation s(j) as the pattern presence/absence evaluation value d41(j) facilitates the setting of the threshold TH1 for pattern presence/absence decision, taking account of the non-uniformity in the level of the sensing signal due to noise.

Third Embodiment

In the first embodiment, the pattern presence/absence decision by the pattern presence/absence evaluation value generation unit 41 and the generation of the weighting coefficients K3, K44 by the correction data updating unit 42 are carried out for each sensing line La. In the third embodiment, however, the generation of the weighting coefficients K3, K44 is carried out for each sensing element 11.

Figure 11:
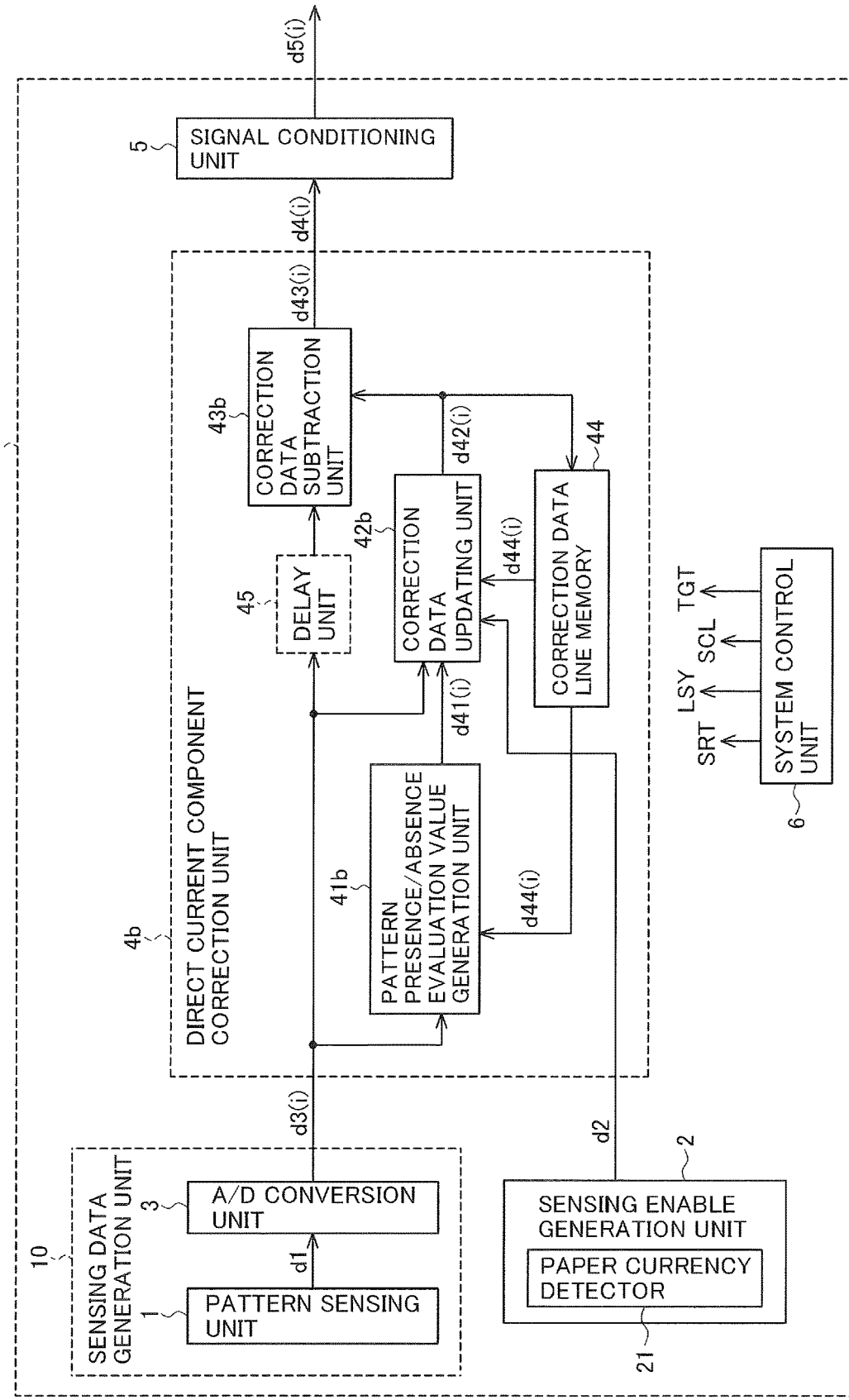
FIG. 11 is a block diagram illustrating an information reading apparatus in a third embodiment of the invention.
Figure 12:
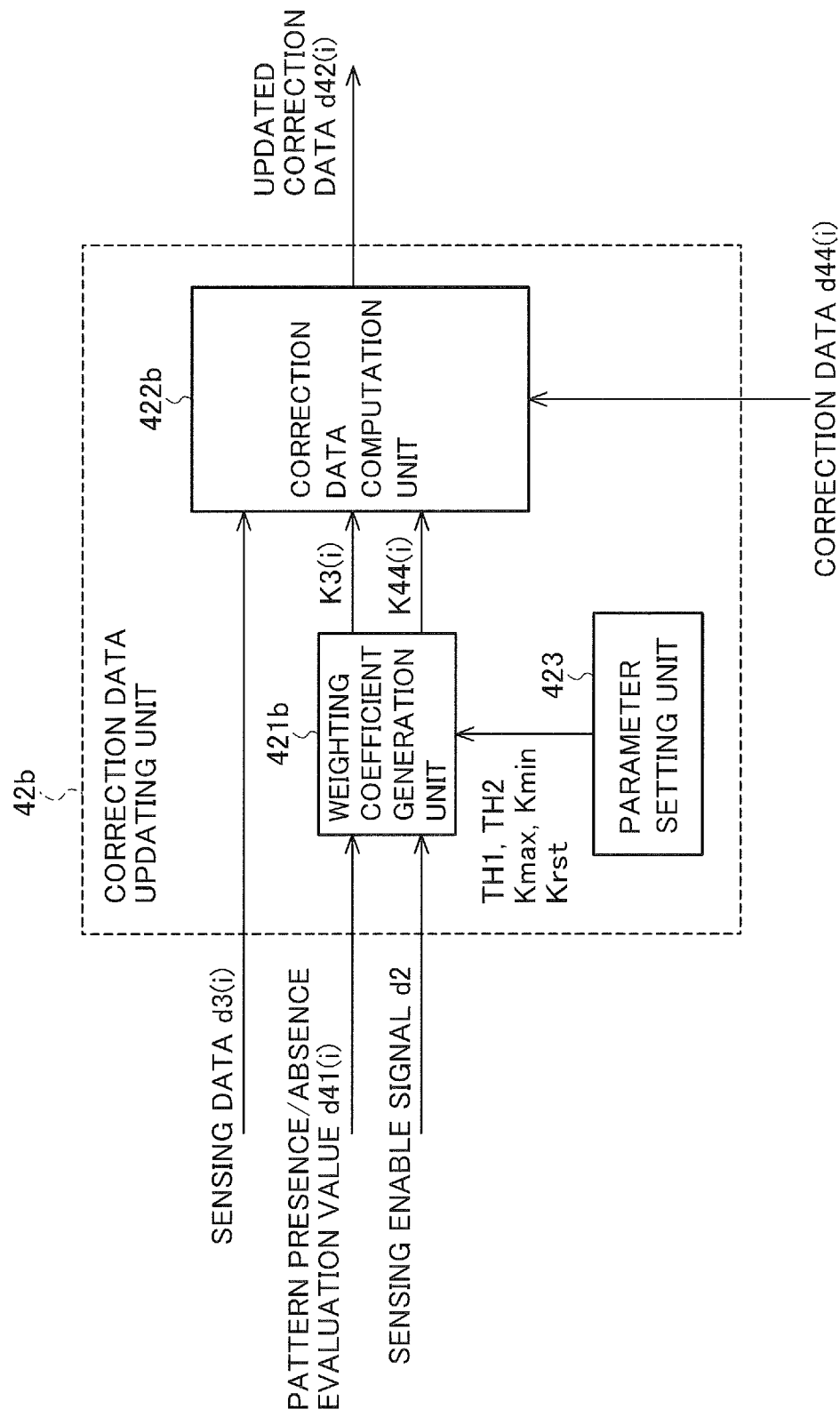
FIG. 12 is a block diagram showing an example of the structure of the correction data updating unit 42b in FIG. 11.

In this case, a direct current component correction unit 4b shown in FIG. 11 is used instead of the direct current component correction unit 4 in FIG. 1. In addition, a correction data updating unit 42b shown in FIG. 12 is used instead of the correction data updating unit 42 in FIG. 5.

FIG. 11 is a block diagram illustrating the information reading apparatus 110. FIG. 12 is a block diagram showing an example of the configuration of the correction data updating unit 42b. Component elements that are the same as in the information reading apparatus 100 in the first embodiment will be given the same reference characters and descriptions will be omitted. The component elements that are the same as in the first embodiment are the sensing data generation unit 10 (the pattern sensing unit 1 and the A/D conversion unit 3), the sensing enable generation unit 2, the correction data line memory 44, the delay unit 45, the system control unit 6, and the signal conditioning unit 5.

The configurations shown in FIGS. 11 and 12 have generally the same block structure and the input-output relationships as in FIGS. 1 and 5, but differ in the following points.

The pattern presence/absence evaluation value generation unit 41 in the first embodiment outputs the line mean value MAD(j) of the absolute values of the differences between the sensing data d3(i) and the correction data d44(i) for the same sensing elements as the pattern presence/absence evaluation value d41(j).

In contrast, a pattern presence/absence evaluation value generation unit 41b outputs the absolute value of the difference between the sensing data d3(i) and the correction data d44(i) for the same sensing element as the pattern presence/absence evaluation value d41(i) of this sensing element 11.

The weighting coefficient generation unit 421 in the correction data updating unit 42 in the first embodiment generates the correction data weighting coefficient K44(j) and the sensing data weighting coefficient K3(j) for each sensing line La according to the pattern presence/absence evaluation value d41(j) of the sensing line La.

In contrast, a weighting coefficient generation unit 421b in the correction data updating unit 42b generates a correction data weighting coefficient K44(i) and a sensing data weighting coefficient K3(i) for each sensing element 11 according to the pattern presence/absence evaluation value d41(i) of the sensing element 11.

The correction data computation unit 422 in the first embodiment performs a computation using the weighting coefficients K44(j), K3(j) generated for each sensing line La. In the above computation, the correction data d44(i) is weighted with the weighting coefficient K44(i), the sensing data d3(i) is weighted with the weighting coefficient K3(j), and the sum of these weighted data is taken.

In contrast, the correction data computation unit 422b performs a computation using the weighting coefficients K44(i), K3(i) generated for each sensing element 11. The difference from the first embodiment is that the weighting coefficients K44(i), K3(i) differ for each sensing element 11. The computation using the weighting coefficients K44(i), K3(i) is the same as in the first embodiment, however. The updated correction data d42(i) is obtained by the computation performed in the correction data computation unit 422b.

Since the correction data updating unit 42b determines the weighting coefficients K3, K44 for each sensing element 11, when signal components corresponding to a magnetic pattern are obtained only from a region in one part of a sensing line La, different methods of updating the correction data can be used in the region from which signal components corresponding to a magnetic pattern are obtained and in other regions.

When the region from which signal components corresponding to a magnetic pattern are obtained occupies only part of a sensing line La, a decision made for each sensing line La will find little inclusion of signal components corresponding to the magnetic pattern in this sensing line La. In this case, the correction data will be updated with a large weight being given to the correction data.

Such update, however, is inappropriate for the parts that include many signal components corresponding to the magnetic pattern.

This will be explained by use of FIG. 2. For example, the region MG3 having a magnetic pattern is positioned on the sensing line La in the paper currency 13. However, the proportion of the sensing line La occupied by the region MG3 is small.

Therefore, when pattern presence/absence is evaluated by the method of the first embodiment, a decision that a magnetic pattern is present (greater than TH2) is not made. As a result, suitable processing is not carried out for the region MG3, which has a magnetic pattern. The region MG3 is a part in which many signal components are included.

In the third embodiment, in contrast, the presence or absence of pattern components is decided for each sensing element 11. Accordingly, if the degree of inclusion of signal components corresponding to the magnetic pattern is large, the sensing elements 11 in the part corresponding to the region MG3 will be processed on the assumption that the magnetic pattern is present. The sending elements 11 other than those in the part corresponding to the region MG3 will be processed on the assumption that the magnetic present is absent.

Accordingly, in the place (the region MG3) where the magnetic pattern is present, the updated correction data d42(i) will have a value close to the correction data d44(i) determined on the basis of the sensing data d3(i) in previous sensing lines La.

In places (regions other than the region MG3) where the magnetic pattern is absent, the updated correction data d42(i) will have a value close to the sensing data d3(i).

The direct current component corrected sensing data d4(i) is obtained by subtracting the updated correction data d42(i) derived in this way from the sensing data d3(i).

From the above, in places (the region MG3) where a magnetic pattern is present, the information reading apparatus 110 according to the third embodiment does not lose the signal components corresponding to the magnetic pattern. In places (regions other than the region MG3) where the magnetic pattern is absent, the information reading apparatus 110 obtains the corrected sensing data d4(i) that are aligned at the level of the target value TGT.

In the second and third embodiments, parts other than those described above may be configured in the same way as in the first embodiment.

In the invalid intervals of the magnetic pattern sensing, the first to third embodiments determines the weighting coefficients K3, K44 based on the a signal from the outside, i.e., the sensing enable signal d2. The weighting coefficients K3, K44 may however be determined based on the correction data d44(i) and the sensing data d3(i) also in the invalid intervals of the magnetic pattern sensing.

In the first embodiment, the paper currency 13 was described as being moved by the transport belt 14. Instead of the transport belt 14, however, the line sensor 12 may be moved. That is, it suffices to produce relative motion between the object being sensed and the line sensor 12, and provide means for producing the relative motion.

This also applies to the second and third embodiments.

Each of the foregoing embodiments was described for the case in which the sensed objects were paper currency. The present invention is also applicable, however, to cases in which the sensed objects are paper notes other than paper currency. The paper notes are not limited to paper material as long as they are similar in shape to paper notes.

The present invention has also been described for the case in which it is used in apparatus for sensing a magnetic pattern. The present invention is also applicable, however, to apparatus for sensing image patterns other than magnetic patterns. The image patterns are not limited to image patterns as long as they are patterns similar to image patterns. For example, the present invention is also applicable to an image sensing apparatus having a plurality of light receiving elements.

The invention has been described above as an information reading apparatus, but the signal processing apparatus constituting part of the information reading apparatus and the signal processing methods executed by the signal processing apparatus also form part of the invention.

Embodiments of the invention have been described as above, but the invention is not limited to these embodiments.

REFERENCE CHARACTERS

1 pattern sensing unit, 2 sensing enable generation unit, 3 A/D conversion unit, 4, 4b direct current component correction unit, 5 signal conditioning unit, 6 system control unit, 11 magnetic sensor, 12 line sensor, 13 paper currency, 21 paper currency detector, 41, 41*b* pattern presence/absence evaluation value generation unit, 42, 42*b* correction data updating unit, 43, 43*b* correction data subtraction unit, 44 correction data line memory, 421, 421*b* weighting coefficient generation unit, 422, 422*b* correction data computation unit, 423 parameter setting unit.

What is claimed is:

1. A signal processing device comprising:
   a processor; and
   a memory storing instructions which, when executed by the processor, performs a process including:
   receiving, as input from a sensing element of a line sensor, sensing data which includes a signal component of a current line of an object being sensed and which is obtained during a sequential sensing of lines, by the line sensor, while the object is being scanned through the line sensor,
   calculating a degree of inclusion of the signal component in the sensing data of the current line of the object,
   generating updated correction data for the current line of the object by calculating a weighted sum of:
   correction data temporarily held in a correction data line memory representing a direct current component of the sensing data up to a previous line of the object sensed while the object is being scanned; and
   the sensing data of the current line of the object,
   with a higher weight being given to the correction data as said degree increases, and a higher weight being given to the sensing data of the current line of the object as said degree decreases,
   generating corrected sensing data of the current line of the object by subtracting the updated correction data from the sensing data of the object being scanned, and
   storing the updated correction data determined from the sensing data up to the current line in the correction data line memory for use in generating updated correction data for a subsequent line of the object to be sensed while the object is being scanned,
   wherein the generating of the updated correction data and the generating of the corrected sensing data are performed in the processor while the object is being scanned.

2. The signal processing device of claim 1, wherein the processor calculates the weighted sum by:
   generating a correction data weighting coefficient that takes a value which is equal to or greater than 0 and is equal to or less than 1 and increases as said degree increases, and generating a sensing data weighting coefficient that sums to 1 when added to the correction data weighting coefficient; and
   adding a value obtained by multiplying the correction data by the correction data weighting coefficient and a value obtained by multiplying the sensing data by the sensing data weighting coefficient.

3. The signal processing device of claim 2, wherein sensing element is a magnetic sensor that senses changes in a magnetic field.

4. The signal processing device of claim 1, wherein the process:
   receives a sensing enable signal that distinguishes between valid intervals and invalid intervals of the sensing data; and
   calculates the weighted sum by giving the sensing data greater weight, regardless of said degree, during the invalid intervals of the sensing data.

5. An information reading apparatus comprising:
   a scanning device which outputs as the sensing data a pattern possessed by an object being sensed by the sensing element, by relative motion of the sensing element and the object being sensed; and
   the signal processing apparatus of claim 4 for processing the sensing data and outputting the corrected sensing data.

6. The signal processing device of claim 4, wherein the sensing element is a magnetic sensor that senses changes in a magnetic field.

7. The signal processing device of claim 1, wherein said line sensor includes a plurality of sensing elements, and said degree is determined for each sensing element.

8. The signal processing device of claim 7, further comprising the correction data line memory, wherein
   the process generates a pattern presence/absence evaluation value as an absolute difference value of the sensing data and the correction data held in the correction data line memory, said pattern presence/absence evaluation value representing said degree, and
   the correction data line memory holds one line of the correction data respectively corresponding to said one or more sensing elements.

9. The signal processing device of claim 8, wherein the sensing element is a magnetic sensor that senses changes in a magnetic field.

10. The signal processing device of claim 7, wherein the sensing element is a magnetic sensor that senses changes in a magnetic field.

11. The signal processing device of claim 1, wherein the sensing element is a magnetic sensor that senses changes in a magnetic field.

12. The signal processing device of claim 1, further comprising the correction data line memory, wherein:
    the process calculates the degree of inclusion of the signal component in the sensing data of the current line on the basis of the correction data held in the correction data memory as well as the sensing data of the current line.

13. A signal processing device comprising:
    a processor; and
    a memory storing instructions which, when executed by the processor, performs a process including:
    receiving, as input from a sensing element, sensing data which includes a signal component of an object being sensed and which is obtained by sequential sensing, by the sensing element, of the object being scanned,
    calculating a degree of inclusion of the signal component in the sensing data of the object being scanned,
    generating updated correction data by calculating a weighted sum of:
    correction data representing a direct current component of the sensing data; and
    the sensing data of the object being scanned,
    with a higher weight being given to the correction data as said degree increases, and a higher weight being given to the sensing data of the object being scanned as said degree decreases, and
    generating corrected sensing data of the object being scanned by subtracting the updated correction data from the sensing data of the object being scanned,
    wherein the generating of the updated correction data and the generating of the corrected sensing data are performed in the processor while the object is being scanned, wherein the processor calculates the weighted sum by:
generating a correction data weighting coefficient that takes a value which is equal to or greater than 0 and is equal to or less than 1 and increases as said degree increases, and generating a sensing data weighting coefficient that sums to 1 when added to the correction data weighting coefficient; and
adding a value obtained by multiplying the correction data by the correction data weighting coefficient and a value obtained by multiplying the sensing data by the sensing data weighting coefficient, and wherein:
the process generates a pattern presence/absence evaluation value representing said degree;
the process further sets a first threshold value, a second threshold value, a maximum value of the correction data weighting coefficient, and a minimum value of the correction data weighting coefficient;
the correction data weighting coefficient is generated as the minimum value of the correction data weighting coefficient when the pattern presence/absence evaluation value is less than the first threshold value,
the correction data weighting coefficient is generated as the maximum value of the correction data weighting coefficient when the pattern presence/absence evaluation value is greater than the second threshold value, and
the correction data weighting coefficient is generated as a value that increases monotonically with the pattern presence/absence evaluation value, from the minimum value of the correction data weighting coefficient to the maximum value of the correction data weighting coefficient, when the pattern presence/absence evaluation value is equal to or greater than the first threshold value and equal to or less than the second threshold value.

14. The signal processing device of claim 13, further comprising a correction data memory for holding the correction data temporarily, wherein:
the pattern presence/absence evaluation value is generated as an absolute difference value of the sensing data and the correction data held in the correction data memory.

15. The signal processing device of claim 14, wherein the sensing element is a magnetic sensor that senses changes in a magnetic field.

16. The signal processing device of claim 13, wherein the sensing element is a magnetic sensor that senses changes in a magnetic field.

17. A signal processing method comprising:
inputting, from a sensing element of a line sensor, sensing data which includes a signal component of a current line of an object being sensed, and which is obtained during a sequential sensing of lines, by the line sensor, of the object being sensed, and calculating a degree of inclusion of the signal component in the sensing data of the object being sensed;
generating updated correction data for the current line of the object by calculating a weighted sum of:
correction data temporarily held in a correction data line memory representing a direct current component of the sensing data up to a previous line of the object sensed while the object is being scanned, and
the sensing data of the current line of the object,
with a higher weight being given to the correction data as said degree increases, and a higher weight given to the sensing data of the current line of the object as said degree decreases;
generating corrected sensing data of the current line of the object by subtracting the updated correction data from the sensing data of the object being sensed; and
storing the updated correction data determined from the sensing data up to the current line in the correction data line memory for use in generating updated correction data for a subsequent line of the object to be sensed while the object is being scanned,
wherein a processor performs both the generating of the updated correction data and the generating of the corrected sensing data while the object is being scanned.

18. An information reading apparatus comprising:
a scanning device which outputs as the sensing data a pattern possessed by an object being sensed by the sensing element, by relative motion of the sensing element and the object being sensed; and
the signal processing device of claim 1 for processing the sensing data and outputting the corrected sensing data.

19. The information reading apparatus of claim 18, wherein said scanning device has a plurality of said sensing elements arranged in a line, and
the process of generating the updated correction data and generating the corrected sensing data is performed for each sensing element.

* * * * *